(12) United States Patent
Morosawa

(10) Patent No.: US 9,721,977 B2
(45) Date of Patent: *Aug. 1, 2017

(54) DISPLAY DEVICE AND ELECTRONIC UNIT

(71) Applicant: JOLED INC., Tokyo (JP)

(72) Inventor: Narihiro Morosawa, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/201,426

(22) Filed: Jul. 2, 2016

(65) Prior Publication Data

US 2016/0315107 A1 Oct. 27, 2016

Related U.S. Application Data

(63) Continuation of application No. 13/417,989, filed on Mar. 12, 2012, now Pat. No. 9,412,763.

(30) Foreign Application Priority Data

Mar. 31, 2011 (JP) .................................. 2011-078493

(51) Int. Cl.
| | | |
|---|---|---|
| *G02F 1/1339* | (2006.01) | |
| *G02F 1/1343* | (2006.01) | |
| *G02F 1/1362* | (2006.01) | |
| *G02F 1/1368* | (2006.01) | |
| *H01L 29/786* | (2006.01) | |
| *H01L 27/12* | (2006.01) | |
| *G02F 1/133* | (2006.01) | |
| *H01L 27/32* | (2006.01) | |
| *G02F 1/1333* | (2006.01) | |

(52) U.S. Cl.
CPC ........ *H01L 27/1255* (2013.01); *G02F 1/1339* (2013.01); *G02F 1/1368* (2013.01); *G02F 1/13306* (2013.01); *G02F 1/13439* (2013.01); *G02F 1/134309* (2013.01); *G02F 1/136213* (2013.01); *H01L 27/1225* (2013.01); *H01L 29/7869* (2013.01); *H01L 29/78618* (2013.01); *H01L 29/78696* (2013.01); *G02F 2001/133357* (2013.01); *H01L 27/3262* (2013.01); *H01L 27/3265* (2013.01); *H01L 2227/323* (2013.01)

(58) Field of Classification Search
None
See application file for complete search history.

(56) References Cited

U.S. PATENT DOCUMENTS

| | | | | |
|---|---|---|---|---|
| 6,103,558 A * | 8/2000 | Yamanaka | .......... | G02F 1/13454 257/E27.111 |
| 6,323,051 B1 * | 11/2001 | Shimada | ............. | G02F 1/13458 257/72 |
| 8,927,991 B2 * | 1/2015 | Cho | .................... | H01L 27/1255 257/59 |

(Continued)

*Primary Examiner* — Ryan Crockett
(74) *Attorney, Agent, or Firm* — Sheridan Ross P.C.

(57) ABSTRACT

A display device includes a substrate, a display element, a transistor as a drive element of the display element, and a holding capacitance element holding electric charge corresponding to a video signal, and including a first conductive film, a first semiconductor layer including an oxide semiconductor, an insulating film, and a second conductive film in order of closeness to the substrate. The display element, the transistor, and the holding capacitance element are provided on the substrate.

8 Claims, 19 Drawing Sheets

(56) References Cited

U.S. PATENT DOCUMENTS

| | | | | |
|---|---|---|---|---|
| 2006/0132411 A1* | 6/2006 | Kim | .................. | G02F 1/136213 |
| | | | | 345/92 |
| 2006/0258059 A1* | 11/2006 | Seo | .................... | G02F 1/13458 |
| | | | | 438/128 |
| 2007/0238227 A1* | 10/2007 | Jun | ..................... | H01L 27/1255 |
| | | | | 438/149 |
| 2009/0002591 A1* | 1/2009 | Yamazaki | ............. | G02F 1/1368 |
| | | | | 349/43 |
| 2010/0224881 A1* | 9/2010 | Park | ................... | H01L 27/3265 |
| | | | | 257/71 |
| 2010/0296015 A1* | 11/2010 | Kim | .................. | G02F 1/134309 |
| | | | | 349/37 |
| 2011/0084276 A1* | 4/2011 | Kang | ............... | H01L 29/78609 |
| | | | | 257/57 |
| 2011/0227079 A1* | 9/2011 | Son | .................... | H01L 27/1214 |
| | | | | 257/59 |
| 2012/0249915 A1* | 10/2012 | Morosawa | .......... | H01L 27/1225 |
| | | | | 349/43 |
| 2013/0193433 A1* | 8/2013 | Yamazaki | ........... | H01L 27/0629 |
| | | | | 257/43 |
| 2013/0221358 A1* | 8/2013 | Morosawa | ........ | H01L 29/66742 |
| | | | | 257/59 |
| 2013/0248856 A1* | 9/2013 | Nakazawa | .......... | H01L 27/1225 |
| | | | | 257/43 |
| 2013/0292677 A1* | 11/2013 | Yamazaki | ........... | H01L 27/1255 |
| | | | | 257/57 |

\* cited by examiner

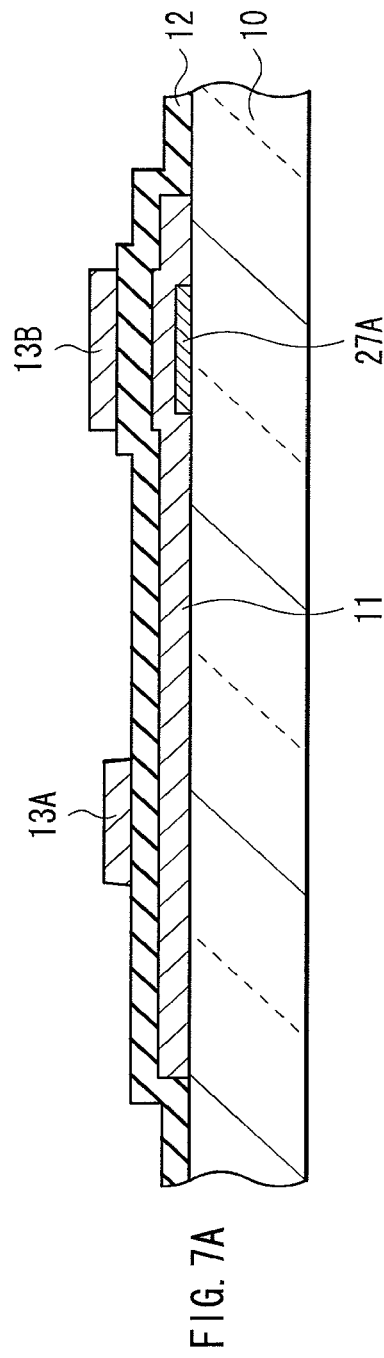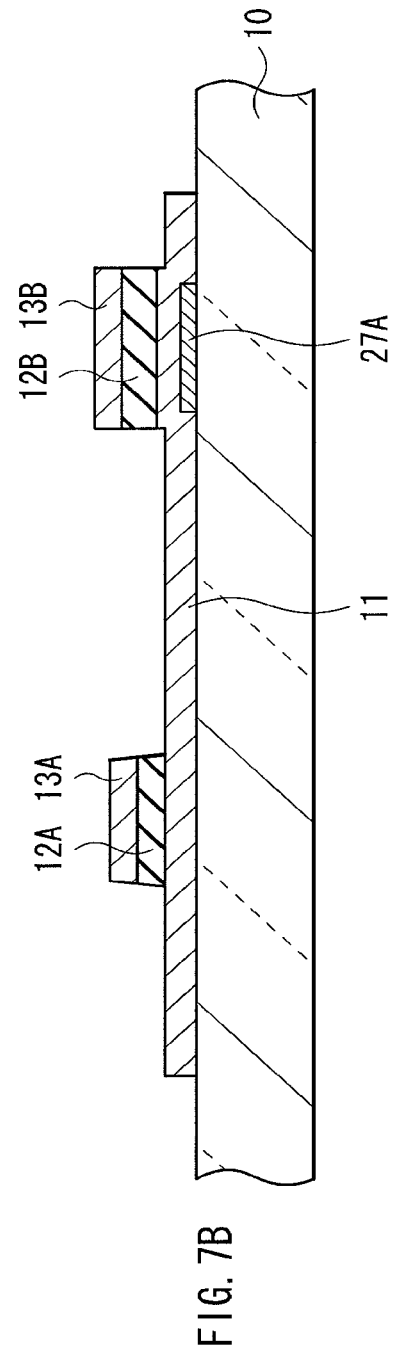

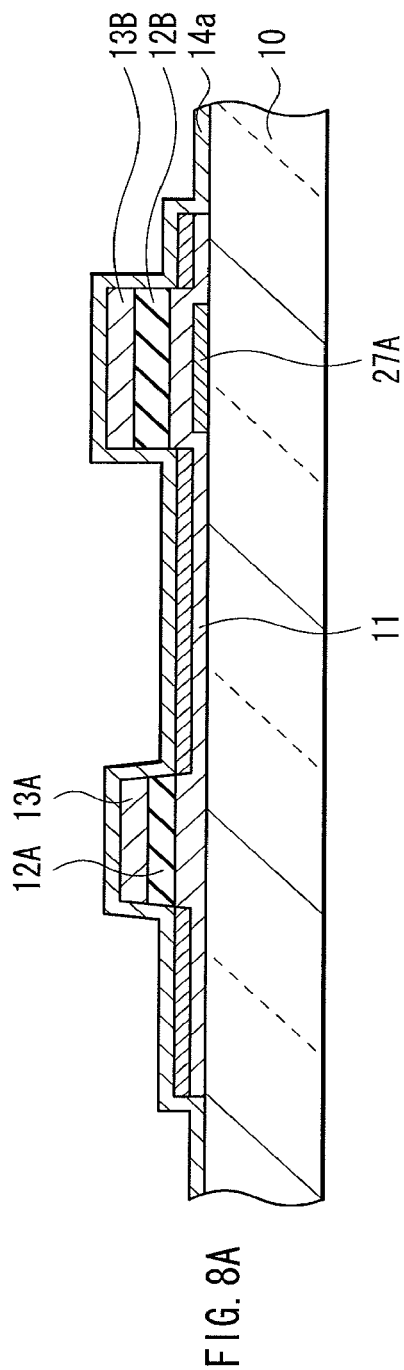
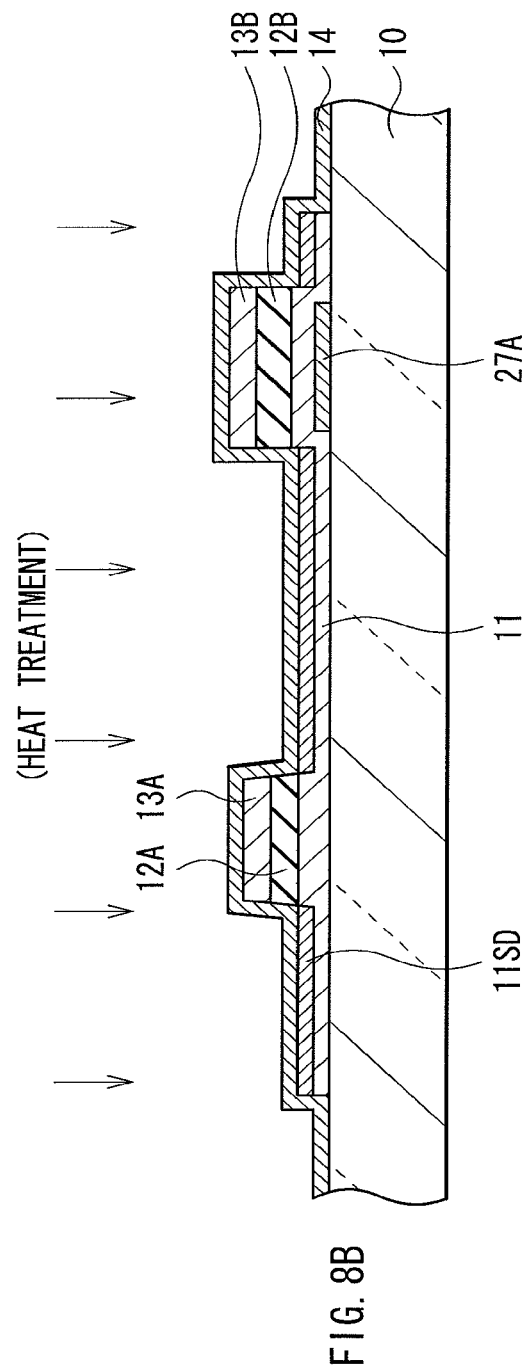

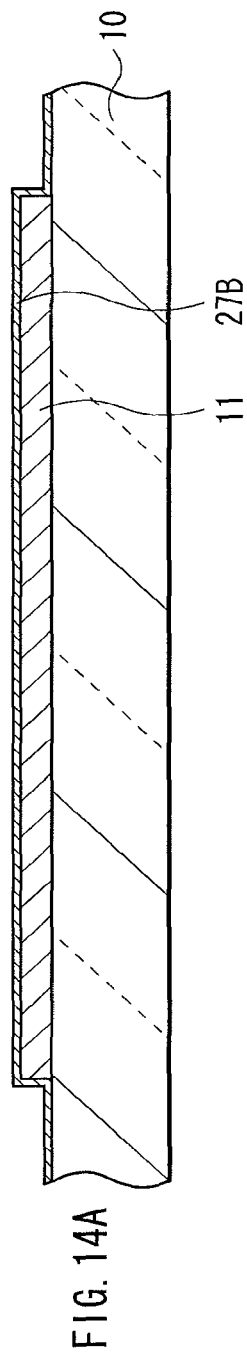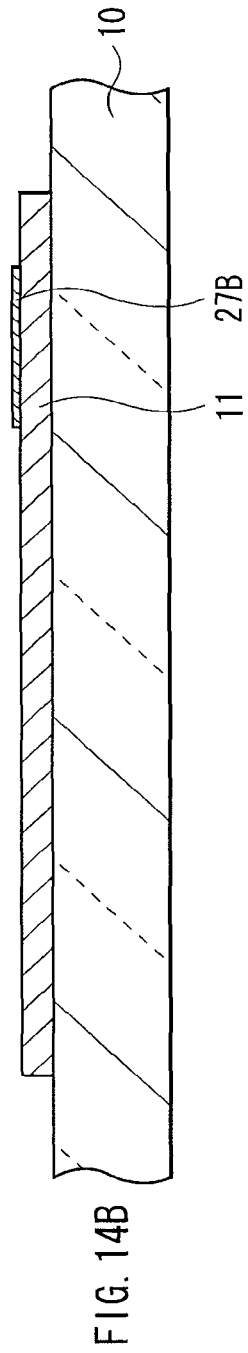

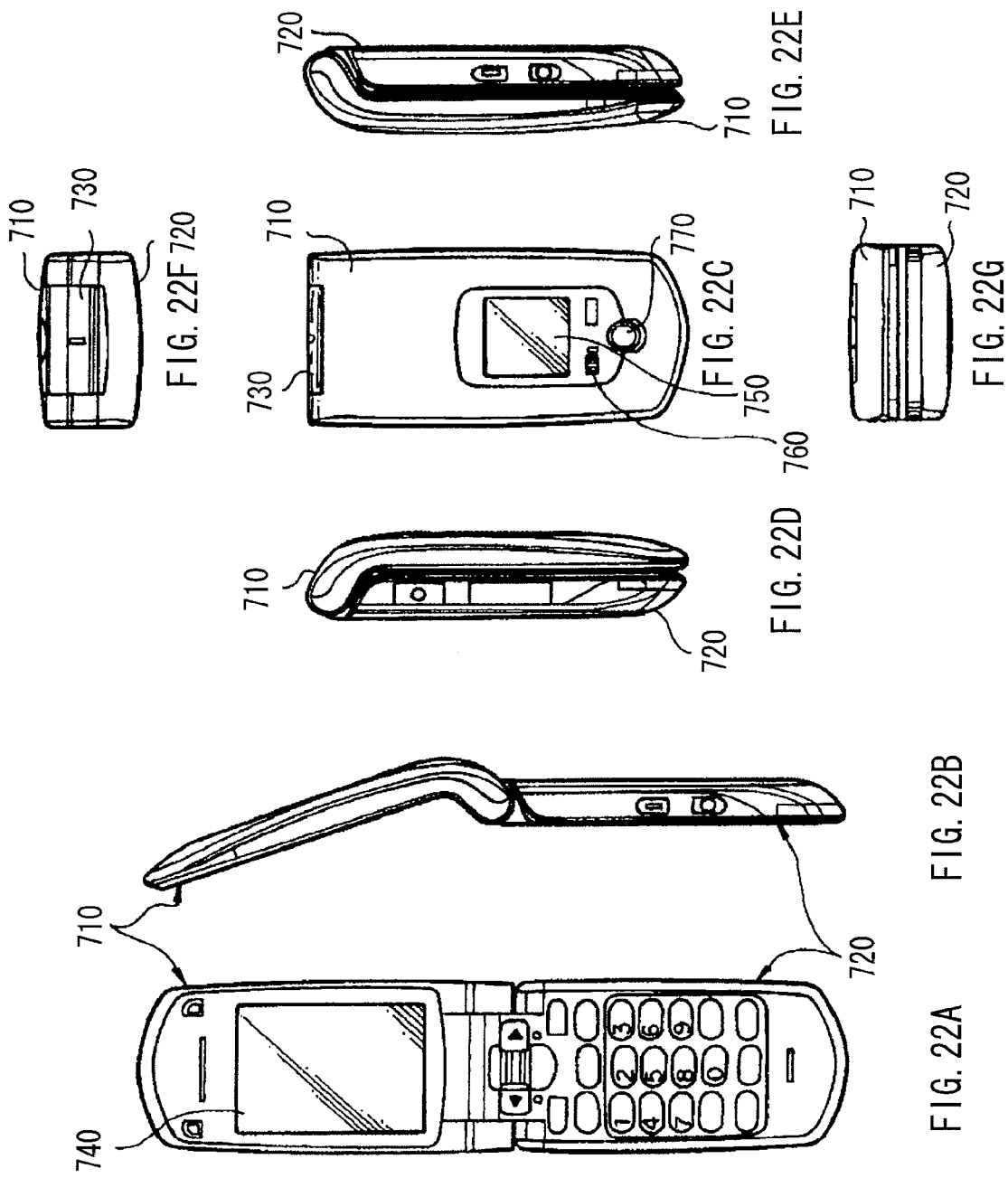

DISPLAY DEVICE AND ELECTRONIC UNIT

CROSS REFERENCES TO RELATED APPLICATIONS

This application is a continuation of U.S. patent application Ser. No. 13/417,989, filed Mar. 12, 2012, which claims priority to Japanese Patent Application No. JP 2011-078493, filed in the Japan Patent Office on Mar. 31, 2011, the entire disclosures of which are hereby incorporated herein by reference.

BACKGROUND

The present disclosure relates to a display device preferable for an organic electroluminescence (EL) display device and a liquid crystal display device, and to an electronic unit including the display device.

In an active-drive liquid crystal display device or organic EL display device, a thin film transistor is used as a driving element, and a holding capacitance element holds electric charge corresponding to signal voltages for recording video images. If parasitic capacitance increases in a crossing region of a gate electrode of the thin film transistor and a source or drain electrode thereof, the signal voltage may vary, leading to degradation in image quality.

In particular, if parasitic capacitance is large in the organic EL display device, capacitance of the holding capacitance element needs to be increased, leading to an increase in occupancy of wirings and the like in a pixel layout. This results in an increase in probability of short circuit between wirings and the like, leading to a reduction in production yield.

For thin film transistors having channels including an oxide semiconductor such as zinc oxide (ZnO) and indium-gallium-zinc oxide (IGZO), the parasitic capacitance, which is formed in a crossing region of the gate electrode and the source or drain electrode, has been tried to be reduced in the past.

For example, Japanese Unexamined Patent Application Publication No. 2007-220817 and J. Park et al., "Self-Aligned Top-Gate Amorphous Gallium Indium Zinc Oxide Thin Film Transistors", Applied Physics Letters, American Institute of Physics, 2008, 93, 053501 each describe a self-aligned top-gate thin film transistor, in which a gate electrode and a gate insulating film are formed in the same shape on a channel region of an oxide semiconductor thin-film layer, and then resistance of a region, which is not covered with the gate electrode and the gate insulating film, of the oxide semiconductor thin-film layer is decreased to form a source/drain region. R. Hayashi et al., "Improved Amorphous In—Ga—Zn—O TFTs", SID 08 DIGEST, 2008, 42.1, pp. 621-624 describes a self-aligned bottom-gate thin film transistor, in which a source and drain regions are formed in an oxide semiconductor film through back exposure with a gate electrode as a mask.

SUMMARY

A holding capacitance element, which is provided on a substrate together with the transistor including an oxide semiconductor as described above, desirably maintains a desired capacitance to suppress degradation in image quality.

It is desirable to provide a display device that suppresses degradation in image quality, and an electronic unit including the display device.

A first display device according to an embodiment of the disclosure includes a substrate, a display element, a transistor as a drive element of the display element, and a holding capacitance element holding electric charge corresponding to a video signal, and including a first conductive film, a first semiconductor layer including an oxide semiconductor, an insulating film, and a second conductive film in order of closeness to the substrate. The display element, the transistor, and the holding capacitance element are provided on the substrate.

In the first display device according to the embodiment of the disclosure, the holding capacitance element, which is provided together with the display element and the transistor on the substrate, is formed into a stacked structure where the first semiconductor layer including the oxide semiconductor and the insulating film are sandwiched between the first and second conductive films. This suppresses variations in capacitance of the holding capacitance element depending on applied voltages.

A second display device according to an embodiment of the disclosure includes a substrate, a display element, a transistor as a drive element of the display element, and a holding capacitance element holding electric charge corresponding to a video signal, and including a first semiconductor layer including an oxide semiconductor, a first conductive film, an insulating film, and a second conductive film in order of closeness to the substrate. The display element, the transistor, and the holding capacitance element are provided on the substrate.

In the second display device according to the embodiment of the disclosure, the holding capacitance element, which is provided together with the display element and the transistor on the substrate, is formed into a stacked structure where the insulating film is sandwiched between the first and second conductive films. This suppresses variations in capacitance of the holding capacitance element depending on applied voltages.

A first electronic unit according to an embodiment of the disclosure includes a display device including a substrate, a display element, a transistor as a drive element of the display element, and a holding capacitance element holding electric charge corresponding to a video signal, and including a first conductive film, a first semiconductor layer including an oxide semiconductor, an insulating film, and a second conductive film in order of closeness to the substrate. The display element, the transistor, and the holding capacitance element are provided on the substrate.

A second electronic unit according to an embodiment of the disclosure includes a display including a substrate, a display element, a transistor as a drive element of the display element, and a holding capacitance element holding electric charge corresponding to a video signal, and including a first semiconductor layer including an oxide semiconductor, a first conductive film, an insulating film, and a second conductive film in order of closeness to the substrate. The display element, the transistor, and the holding capacitance element are provided on the substrate.

According to the first display device and the first electronic unit according to the embodiments of the disclosure, the holding capacitance element, which is provided together with the display element and the transistor on the substrate, is formed into a stacked structure where the first semiconductor layer including the oxide semiconductor and the insulating film are sandwiched between the first and second conductive films. This suppresses variations in capacitance of the holding capacitance element depending on applied voltages, so that a desired capacitance is maintained. As a result, degradation in image quality is suppressed.

According to the second display device and the second electronic unit according to the embodiments of the disclosure, the holding capacitance element, which is provided together with the display element and the transistor on the substrate, is formed into a stacked structure where the insulating film is sandwiched between the first and second conductive films. This suppresses variations in capacitance of the holding capacitance element depending on applied voltages, so that a desired capacitance is maintained. As a result, degradation in image quality is suppressed.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 7A and 7B illustrate steps following the step in FIG. 6B.

FIGS. 8A and 8B illustrate steps following the step in FIG. 7B.

FIGS. 14A and 14B explain a manufacturing process of the organic EL display device shown in FIG. 12.

FIGS. 22A and 22B are a front view and a side view of an application example 5 in an open state, respectively, and FIGS. 22C to 22G are a front view, a left side view, a right side view, a top view, a bottom view of the application example 5 in a closed state, respectively.

DETAILED DESCRIPTION

Embodiments of the disclosure are described in detail below with reference to the accompanying drawings. Description is made in the following order.
1. First embodiment (example of an organic EL display device having a holding capacitance element including an oxide semiconductor layer and a gate insulating film between a pair of conductive films (including a conductive film below the oxide semiconductor layer)).
2. Second embodiment (example of an organic EL display device having a holding capacitance element including a gate insulating film between a pair of conductive films (including a conductive film above an oxide semiconductor layer)).
3. Modification (example of a liquid crystal display device).
4. Applications (examples of a module and electronic units).

First Embodiment

[Configuration]

Figure 1:
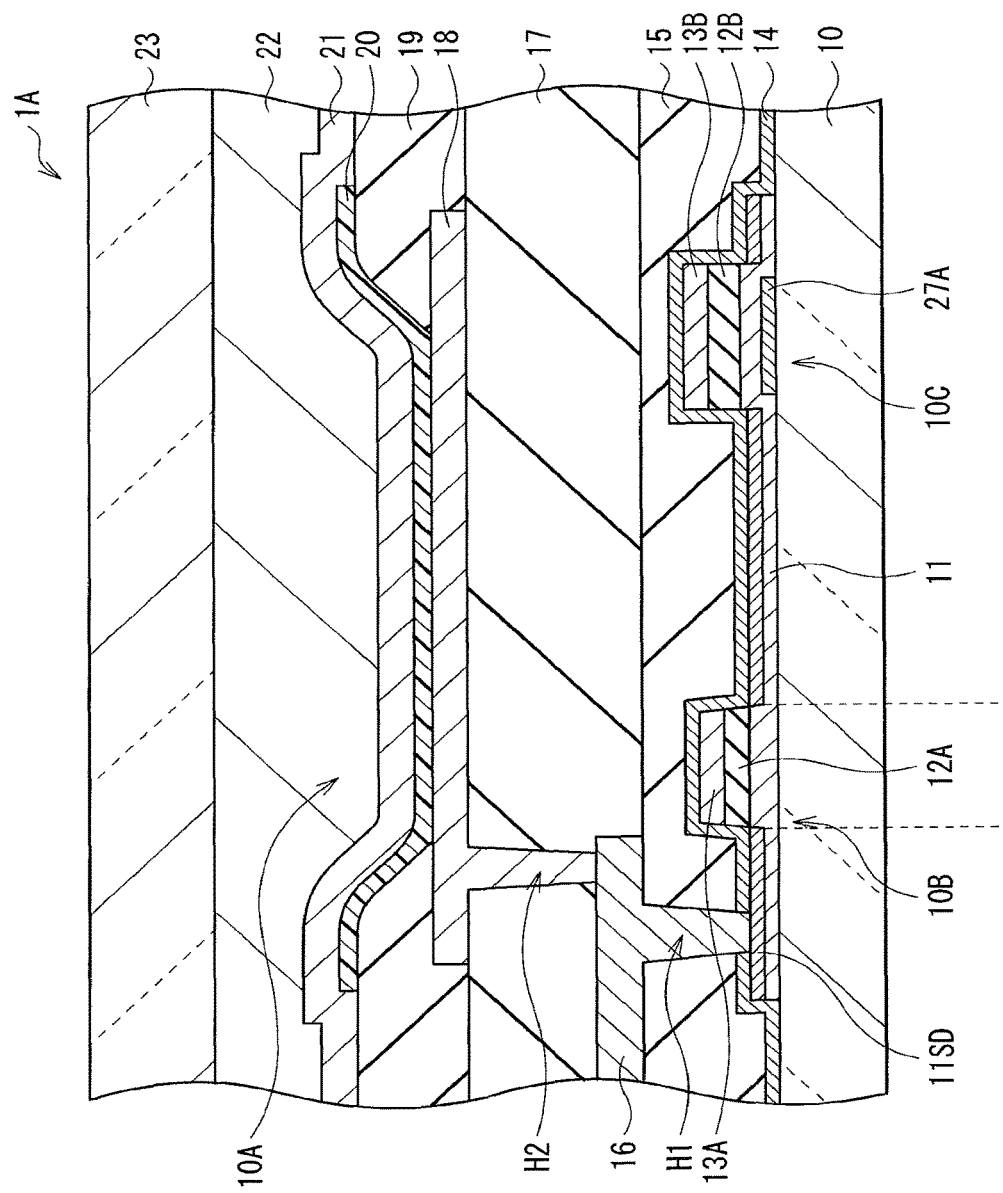
FIG. 1 illustrates a sectional structure of an organic EL display device according to a first embodiment of the disclosure.

FIG. 1 illustrates a sectional structure of a display device (organic EL display device 1A) according to a first embodiment of the disclosure. The organic EL display device 1A includes a plurality of pixels (organic EL elements 10A) that are driven by active-matrix drive, for example. FIG. 1 shows only a region corresponding to one pixel (sub-pixel). In the organic EL display device 1A, for example, a transistor 10B and a holding capacitance element 10C are provided on a substrate 10, and the organic EL element 10A is provided above the components. The organic EL element 10A is sealed by, for example, a passivation layer 22, and a sealing substrate 23 is attached on the passivation layer 22 with an undepicted adhesive layer therebetween. An emission type of the organic EL display device 1A may be a so-called top emission type or a bottom emission type. A configuration of each of the organic EL element 10A, the transistor 10B, and the holding capacitance element 10C is specifically described below.

[Organic EL Element 10A]

The organic EL element 10A has a pixel separation film 19 having an opening for each pixel on a first electrode 18, and has an organic layer 20 in the opening of the pixel separation film 19. A second electrode 21 is provided on the organic layer 20.

The first electrode 18, which functions as an anode, for example, is provided for each pixel. In the bottom emission type, the first electrode 18 is configured of a transparent conductive film, for example, a single-layer film including one of indium-tin oxide (ITO), indium-zinc oxide (IZO), and indium/zinc oxide (InZnO) or a stacked film including two or more of them. In the top emission type, the first electrode 18 is configured of a single-layer film including a simple metal including one or more of aluminum (Al), magnesium (Mg), calcium (Ca), and sodium (Na), or a single-layer film including an alloy including one or more of the metals, or a multilayer film including two or more of the single-layer films.

The pixel separation film 19 defines a light emission region of each pixel, and includes, for example, a photosensitive resin such as polyimide resin, acryl resin, and novolac resin.

The organic layer 20 includes an organic electroluminescence layer (organic EL layer), and emits light in response to an applied drive current. The organic layer 20 includes, for example, a hole injection layer, a hole transport layer, the organic EL layer, and an electron transport layer, all of which are not shown, in this order of closeness to the substrate 10. In the organic EL layer, electrons recombine with holes due to an applied electric field, resulting in light emission. A material of the organic EL layer may include typical, low-molecular or high-molecular organic materials without any limitation. For example, color light-emitting layers of red, green, and blue can be separately applied for each pixel, or a white light-emitting layer (for example, stacked color light-emitting layers of red, green, and blue) can be provided over the entire surface of a substrate. The hole injection layer improves hole injection efficiency, and prevents electric leakage. The hole transport layer improves hole transport efficiency to the organic EL layer. The layers other than the organic EL layer may be provided as necessary.

The second electrode 21, which functions as a cathode, for example, is configured of a metal conductive film. In the bottom emission type, the second electrode 21 is configured of a single-layer film including a simple metal including one or more of aluminum, magnesium, calcium, and sodium or a single-layer film including an alloy including one or more of the metals, or a multilayer film of two or more of the single-layer films. In the top emission type, the second electrode 21 includes a transparent conductive film including ITO or IZO, for example. The second electrode 21 is provided on the organic layer 20 in common to all pixels while being isolated from the first electrode 18.

The passivation layer 22 may be configured of an insulating material or a conductive material. The insulating material includes, for example, amorphous silicon (a-Si), amorphous silicon carbide (a-SiC), amorphous silicon nitride ($a\text{-}Si_{1-x}N_x$), and amorphous carbon (a-C).

The substrate 10 and the sealing substrate 23 each include, for example, a sheet material including quartz, glass, silicon, and plastic. Inexpensive plastic films are allowed to be used for the substrates because a semiconductor layer 11 is deposited without heating the substrate 10 by a sputter process described below. The plastic material includes, for example, polyethylene terephthalate (PET) and polyethylene naphthalate (PEN). Alternatively, a metal substrate including stainless steel (SUS) can be used depending on the purposes. In the top emission type, the sealing substrate 23, which includes a transparent substrate including glass or plastic, may have an undepicted color filter or light shielding film thereon. In the bottom emission type, the substrate 10 includes a transparent substrate.

[Transistor 10B]

The transistor 10B corresponds to, for example, a sampling transistor Tr1 or a driving transistor 5B in a pixel circuit 50a described below, and is a thin film transistor having a staggered structure, or a so-called top-gate, thin film transistor. The transistor 10B has the semiconductor layer 11 on the substrate 10, and has a gate electrode 13A on a selective region in the semiconductor layer 11 with a gate insulating film 12A therebetween. An interlayer insulating film 15 is provided covering the semiconductor layer 11, the gate insulating film 12A, and the gate electrode 13A. The interlayer insulating film 15 has a contact hole H1 configured to oppose the semiconductor layer 11, and a source/drain electrode layer 16 is provided on the interlayer insulating film 15 so as to fill the contact hole H1. Consequently, the source/drain electrode layer 16 is electrically connected to a predetermined region (a source/drain region 11SD described below) of the semiconductor layer 11.

In the embodiment, the semiconductor layer 11 is provided from the transistor 10B to the holding capacitance element 10C. Specifically, in the semiconductor layer 11, a portion corresponding to the transistor 10B corresponds to "second semiconductor layer", and a portion corresponding to the holding capacitance element 10C described below corresponds to "first semiconductor layer". The semiconductor layer 11 corresponds to a specific example of a configuration where the "first semiconductor layer" and the "second semiconductor layer" are integrally provided.

The semiconductor layer 11 forms a channel in response to an applied gate voltage, and includes, for example, an oxide semiconductor including one or more of indium (In), gallium (Ga), zinc (Zn), silicon (Si), and tin (Sn). Such an oxide semiconductor includes, for example, an amorphous oxide semiconductor such as indium-tin-zinc-oxide (ITZO) and indium-gallium-zinc-oxide (IGZO, InGaZnO). In addition, the oxide semiconductor includes crystalline oxide semiconductor including zinc oxide (ZnO), indium-zinc oxide (IZO), indium-gallium oxide (IGO), ITO, and indium oxide (InO). The semiconductor layer 11 has the source/drain region 11SD, which is a connection region to the source/drain electrode layer 16, adjacent to a region (channel region 11A) opposed to the gate electrode 13A. Thickness of the semiconductor layer 11 is, for example, about 50 nm. It is to be noted that the semiconductor layer 11 has a low-resistance region having a lower electric resistivity than other regions in a part of a region unopposed to the gate electrode 13A and the holding capacitance element 10C on a top side of the semiconductor layer.

The source/drain region 11SD, which is provided in a part of the semiconductor layer 11 in a depth direction from a top, has a lower electric resistance than the channel region 11A. Such low resistance of the source/drain region 11SD is provided by diffusing metal such as aluminum in the oxide semiconductor through a reaction of the metal during a manufacturing process as described below. As a result, the transistor 10B has a so-called self-aligned structure and has stable characteristics.

The gate insulating film 12A includes, for example, a single-layer film including one of silicon oxide ($SiO_x$), silicon nitride ($SiN_x$), silicon oxynitride (SiON), and aluminum oxide ($AlO_x$), or a stacked film including two or more of the single-layer films. Among them, the silicon oxide film or the aluminum oxide film is preferable since it hardly deoxidize the oxide semiconductor. Thickness of the gate insulating film 12A is, for example, about 300 nm. In the embodiment, since the gate insulating film 12A and an insulating film 12B of the holding capacitance element 10C are formed of the same material in the same step, the thickness of the gate insulating film 12A is substantially the same as that of the insulating film 12B. This is reflected in setting of the thickness of the gate insulating film 12A since the capacitance of the holding capacitance element 10C depends on the thickness of the insulating film 12B.

The gate electrode 13A applies a gate voltage (Vg) to the transistor 10B to control the carrier density in the semiconductor layer 11, and functions as a wiring for supplying an electric potential to the transistor. The gate electrode 13A includes, for example, a simple metal or an alloy including one of molybdenum (Mo), titanium (Ti), aluminum, silver, neodymium (Nd), and copper (Cu), or a stacked film including two or more of them. Specifically, the gate electrode 13A includes a stacked structure where a low-resistance metal such as aluminum or silver is sandwiched by molybdenum or titanium, or includes an alloy of aluminum and neodymium (AlNd alloy). Alternatively, the gate electrode 13A may be configured of a transparent conductive film such as ITO. Thickness of the gate electrode 13A is, for example, about 10 nm to 500 nm both inclusive.

The interlayer insulating film 15 has a thickness of, for example, about 2 µm, and includes, for example, a single-layer film including one of a silicon oxide film, a silicon nitride film, a silicon oxynitride film, and an aluminum oxide film, or a stacked film including two or more of them. Alternatively, the interlayer insulating film 15 may include an organic insulating film including acryl or polyimide resin. In particular, use of a stacked film of the silicon oxide film and the aluminum oxide film suppresses infiltration or diffusion of water to the semiconductor layer 11, improving electric characteristics and reliability of the transistor 10B.

The source/drain electrode layer 16 functions as a source or drain electrode of the transistor 10B. The source/drain electrode layer 16 has, for example, a thickness of about 200 nm, and includes a similar metal to those listed for the gate electrode 13A or a similar transparent conductive film. The source/drain electrode layer 16 is preferably configured of a low-resistance metal such as aluminum or copper, and more preferably configured of a stacked film where such a low-resistance metal is sandwiched by barrier layers including titanium or molybdenum, for example. Use of such a stacked film enables a reduction in wiring delay in driving. The source/drain electrode layer 16 is desirably provided in a region other than a portion directly above the gate electrode 13A in order to prevent formation of parasitic capacitance in a crossing region of the gate electrode 13A and the source/drain electrode layer 16.

A planarization film 17 is provided covering the interlayer insulating film 15 and the source/drain electrode layer 16. The planarization film 17 includes, for example, polyimide or acryl resin, and is provided over the entire display region. However, the planarization film 17 has a contact hole H2 for electrically connecting the source/drain electrode layer 16 of the transistor 10B to the first electrode 18 of the organic EL element 10A. The first electrode 18 is provided on the planarization film 17 so as to fill the contact hole H2.

[Holding Capacitance Element 10C]

Figure 2:
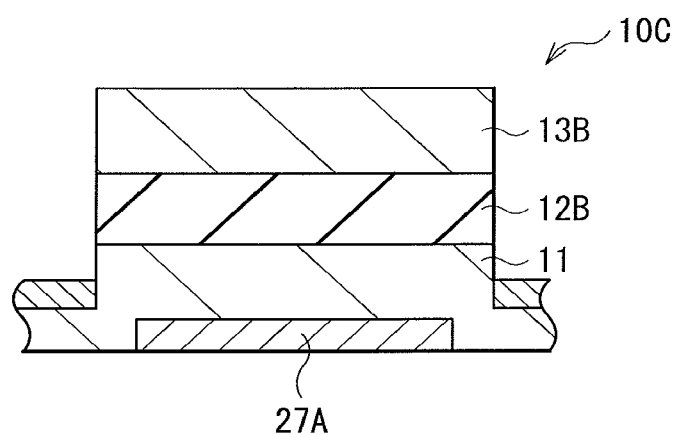
FIG. 2 illustrates a sectional structure of a holding capacitance element shown in FIG. 1 in an enlarged manner.

The holding capacitance element 10C holds electric charge corresponding to video signals in a pixel circuit 50a described below, for example. FIG. 2 illustrates an enlarged sectional structure of the holding capacitance element 10C. The holding capacitance element 10C has a certain capacitance due to a stacked structure using part of the semiconductor layer 11 of the transistor 10B. In detail, the holding capacitance element 10C has a stacked structure of a conductive film 27A, the semiconductor layer 11, the insulating film 12B, and a conductive film 13B in order of closeness to a substrate 10. In the embodiment, the conductive film 27A is provided below the semiconductor layer 11 (on a region closer to the substrate 10). In the holding capacitance element 10C, the semiconductor layer 11 extends from (is provided integrally with) the transistor 10B, and the conductive film 27A, the insulating film 12B, and the conductive film 13B are provided in a selective region separated from the transistor 10B.

It is to be noted that the conductive film 27A of the holding capacitance element 10C corresponds to a specific example of "first conductive film" of the first display device of the disclosure, and the conductive film 13B corresponds to a specific example of "second conductive film" thereof.

The insulating film 12B is formed of, for example, the same material as that of the gate insulating film 12A of the transistor 10B, and formed in the same step as that thereof. Similarly, the conductive film 13B is formed of, for example, the same material as that of the gate electrode 13A, and formed in the same step as that thereof.

The conductive film 27A includes, for example, a single-layer film including one of titanium, aluminum, and molybdenum, or a stacked film including two or more of them, and has a thickness of, for example, about 50 nm. In the embodiment, the conductive film 27A is formed before formation of the semiconductor layer 11 as described below in detail.

[High-Resistance Film 14]

A high-resistance film 14 is provided covering the holding capacitance element 10C, the gate insulating film 12A and the gate electrode 13A of the transistor 10B, and a region (low-resistance region) on the semiconductor layer 11 unopposed to each of the gate electrode 13A and the holding capacitance element 10C. A portion of the high-resistance film 14 opposed to the source/drain electrode layer 16 is selectively removed.

The high-resistance film 14 is an oxide film changed from a metal film, which functions as a supply source of metal that is diffused into the low-resistance region (for example, the source/drain region 11SD) of the semiconductor layer 11 during a manufacturing process as described below. Such a high-resistance film 14 includes, for example, titanium oxide, aluminum oxide, indium oxide, and tin oxide. The high-resistance film 14 has a high barrier performance against the external atmosphere, and thus has a function of reducing influence of oxygen and water, which may change the electric characteristics of the semiconductor layer 11 of the transistor 10B, in addition to the above-described function in the manufacturing process. The high-resistance film 14 stabilizes the electric characteristics of each of the transistor 10B and the holding capacitance element 10C, which enhances the effect of the interlayer insulating film 15. Thickness of the high-resistance film 14 is, for example, 20 nm or less.

[Configurations of Peripheral Circuits and Pixel Circuit]

Figure 3:
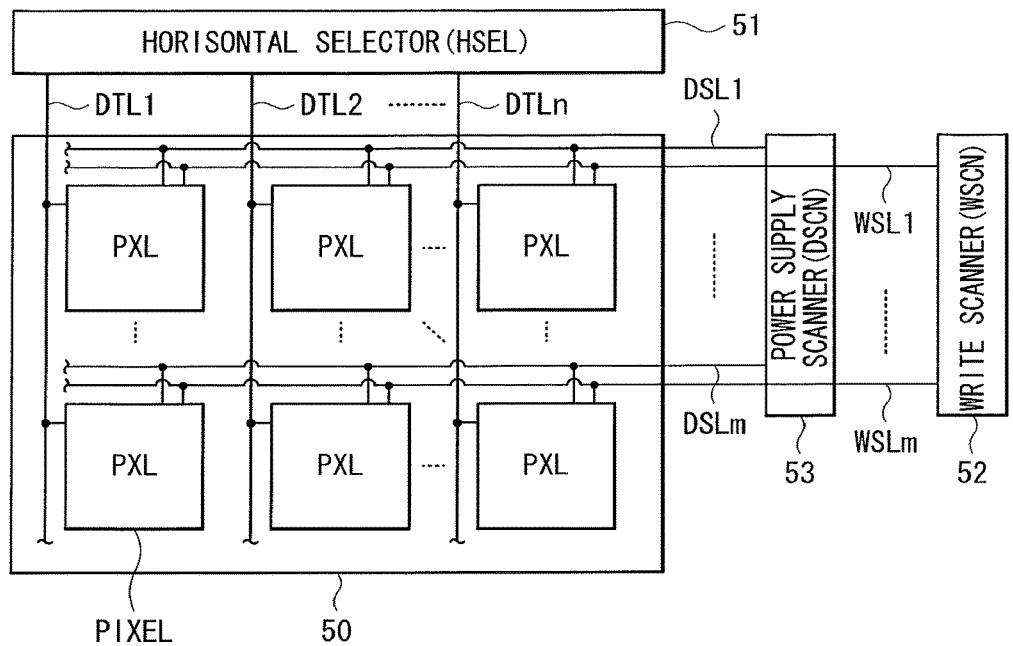
FIG. 3 illustrates an overall configuration of the organic EL display device shown in FIG. 1 and peripheral circuits thereof.

Configurations of peripheral circuits and a pixel circuit of the above-described organic EL display device 1A are now described. FIG. 3 illustrates an overall configuration of the organic EL display device 1A and the peripheral circuits thereof. As shown in the figure, for example, a display region 50, in which a plurality of pixels PXL including the organic EL elements 10A are arranged in a matrix, is provided on the substrate 10, and a horizontal selector (HSEL) 51 as a signal-line drive circuit, a write scanner (WSCN) 52 as a scan-line drive circuit, and a power supply scanner (DSCN) 53 as a power-supply-line drive circuit are provided in the periphery of the display region 50.

In the display region 50, a plurality of (an integer n) signal lines DTL1 to DTLn are arranged in a column direction, and a plurality of (an integer m) scan lines WSL1 to WSLm and a plurality of power supply lines DSL1 to DSLm are arranged in a row direction. Each pixel PXL (one of pixels corresponding to R, G, and B) is provided at an intersection of each signal line DTL and each scan line WSL. Each signal line DTL is connected to the horizontal selector 51 which supplies a video signal to each signal line DTL. Each scan line WSL is connected to the write scanner 52 which supplies a scan signal (selection pulse) to each scan line WSL. Each power supply line DSL is connected to the power supply scanner 53 which supplies a power supply signal (control pulse) to each power supply line DSL.

Figure 4:
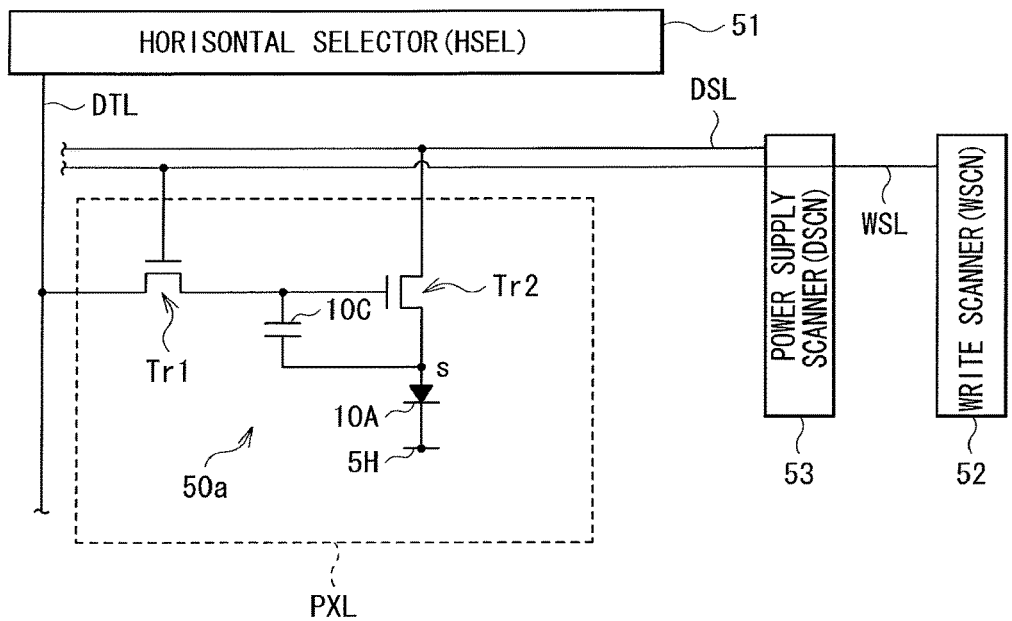
FIG. 4 illustrates a circuit configuration of a pixel shown in FIG. 3.

FIG. 4 specifically illustrates an exemplary circuit configuration of the pixel PXL. Each pixel PXL has a pixel circuit 50*a* including the organic EL element 10A. The pixel circuit 50*a* is an active drive circuit including the sampling transistor Tr1, a driving transistor Tr2, the holding capacitance element 10C, and the organic EL element 10A. The sampling transistor Tr1 (or the driving transistor Tr2) corresponds to the transistor 10B in the above-described embodiment and the like.

A gate of the sampling transistor Tr1 is connected to a corresponding scan line WSL, one of a source and drain thereof is connected to a corresponding signal line DTL, and the other is connected to a gate of the driving transistor Tr2. A drain of the driving transistor Tr2 is connected to a corresponding power supply line DSL, and a source thereof is connected to an anode of the organic EL element 10A. A cathode of the organic EL element 10A is connected to a ground line 5H. It is to be noted that the ground line 5H is wired in common to all the pixels PXL. The holding capacitance element 10C is disposed between the source and gate of the driving transistor Tr2.

The sampling transistor Tr1 becomes conductive in response to a scan signal (selection pulse) supplied from the scan line WSL, and thus samples a signal potential of a video signal supplied from the signal line DTL, and holds the signal potential in the holding capacitance element 10C. The driving transistor Tr2 receives a current from the power supply line DSL set to a predetermined, first potential (not shown), and supplies a drive current to the organic EL element 10A depending on the signal potential held in the holding capacitance element 10C. The organic EL element 10A emits light at a luminance depending on the signal potential of the video signal in response to the drive current supplied from the driving transistor Tr2.

In such a circuit configuration, the sampling transistor Tr1 becomes conductive in response to the scan signal (selection pulse) supplied from the scan line WSL, and thus the signal potential of the video signal supplied from the signal line DTL is sampled and held in the holding capacitance element 10C. The current is supplied from the power supply line DSL set to the first potential to the driving transistor Tr2, and the drive current is supplied to the organic EL element 10A (each of the organic EL elements of red, green, and blue) depending on the signal potential held in the holding capacitance element 10C. Each organic EL element 10A emits light at the luminance depending on the signal potential of the video signal in response to the supplied drive current. Consequently, the display device displays a video image on the basis of the video signals.

[Manufacturing Method]

The above-described organic EL display device 1A is manufactured, for example, as follows. The transistor 10B and the holding capacitance element 10C are first formed on the substrate 10.

Figure 5A:
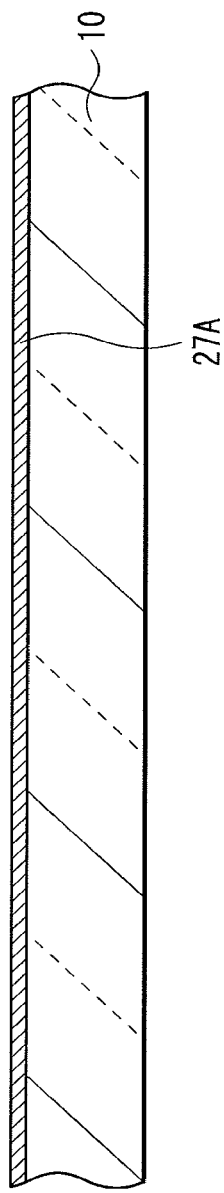
FIGS. 5A and 5B illustrate sequential steps of a manufacturing process of the organic EL display device shown in FIG. 1.
Figure 5B:
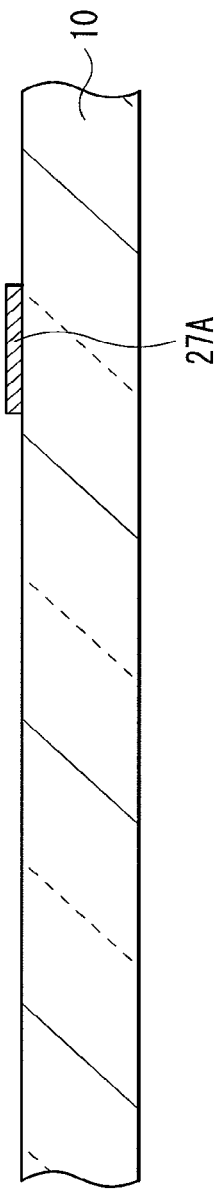

Specifically, the conductive film 27A including the above-described material is first deposited by, for example, a sputtering process on the entire surface of the substrate 10, as shown in FIG. 5A. The conductive film 27A is then patterned by, for example, photolithography and etching to be provided on a selective region (a capacitance formation region) in the substrate 10, as shown in FIG. 5B.

Figure 6A:
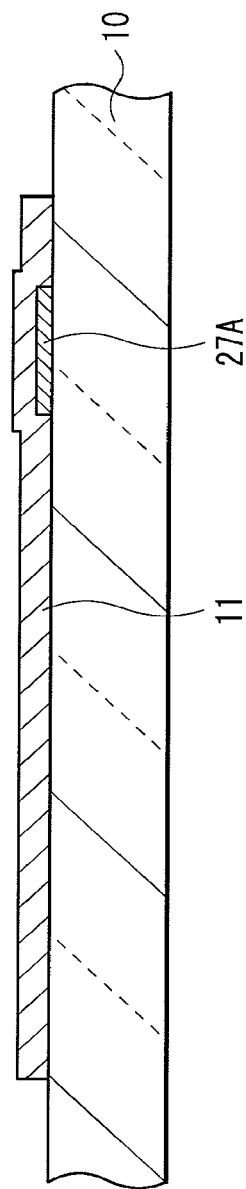
FIGS. 6A and 6B illustrate steps following the step in FIG. 5B.

Then, the semiconductor layer 11 including the above-described oxide semiconductor is deposited as shown in FIG. 6A. In detail, the semiconductor layer 11 is deposited covering the conductive film 27A by, for example, a sputtering process on the entire surface of the substrate 10, as shown in FIG. 6A. In such deposition, a ceramic having the same composition as that of the objective oxide semiconductor is used for a target. Since the carrier concentration in the oxide semiconductor greatly depends on oxygen partial pressure during the sputtering, the oxygen partial pressure is controlled so as to achieve desired transistor characteristics. Then, the semiconductor layer 11 is patterned into a predetermined shape by, for example, photolithography and etching. In the patterning, the semiconductor layer 11 is preferably processed by wet etching using a mixed solution of phosphoric acid, nitric acid, and acetic acid. The mixed solution of phosphoric acid, nitric acid, and acetic acid may significantly increase etching selectivity of the semiconductor layer to the substrate, leading to relatively easy processing.

Figure 6B:
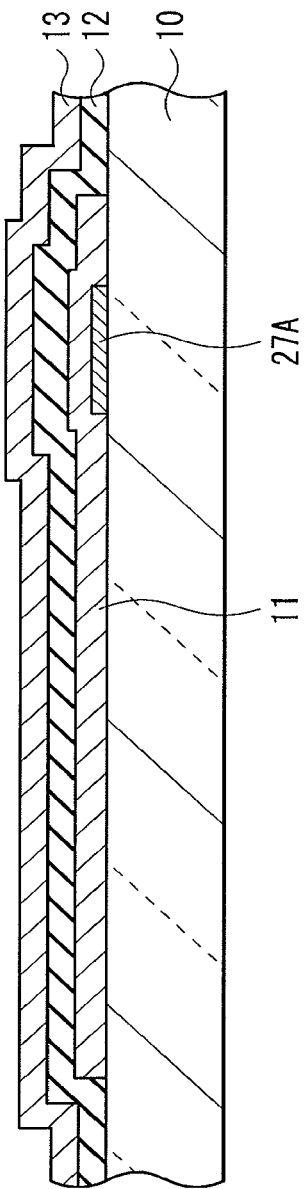

Then, the insulating film 12 (the gate insulating film 12A and the insulating film 12B) including, for example, a silicon oxide film is deposited by, for example, a plasma chemical vapor deposition (CVD) process over the entire surface of the substrate 10, as shown in FIG. 6B. Alternatively, the silicon oxide film may be formed by a reactive sputtering process. An aluminum oxide film is deposited not only by the reactive sputtering process and the CVD process, but also by an atomic layer deposition process.

The conductive film 13 (the gate electrode 13A and the conductive film 13B) including, for example, a stacked film of a molybdenum or titanium film and an aluminum film is then deposited by, for example, a sputtering process on the entire surface of the insulating film 12, as shown in FIG. 6B.

The conductive film 13 is then patterned by, for example, photolithography and etching so as to form the gate electrode 13A and the conductive film 13B on selective regions in the semiconductor layer 11, as shown in FIG. 7A.

The insulating film 12 is then etched with the gate electrode 13A and the conductive film 13 as a mask, as shown in FIG. 7B. Here, in the case where the semiconductor layer 11 is formed of a crystalline material such as ZnO, IZO, and IGO, hydrofluoric acid, for example, may be used to maintain a large etching selectivity, so that the etching process is facilitated. Consequently, the gate insulating film 12A is patterned in the same shape as that of the gate electrode 13A, and the insulating film 12B and the conductive film 13B are formed on the conductive film 27A. In this way, the holding capacitance element 10C including the stacked structure of the conductive film 27A, the semiconductor layer 11, the insulating film 12B, and the conductive film 13B is formed on the selective region in the substrate 10.

A metal film 14*a* including a metal, which reacts with oxygen at a relatively low temperature, such as titanium, aluminum, and indium is then deposited by, for example, a sputtering process at a thickness of, for example, 5 nm to 10 nm both inclusive over the entire surface of the substrate 10, as shown in FIG. 8A.

The metal film 14*a* is then subjected to heat treatment at a temperature of, for example, about 300° C. so as to be oxidized, leading to formation of the high-resistance film 14 including a metal oxide film, as shown in FIG. 8B. The low-resistance region (including the source/drain region 11SD) is concurrently formed in a region unopposed to the gate electrode 13A and the holding capacitance element 10C. Since part of oxygen contained in the oxide semiconductor is used for the oxidation reaction of the metal film 14a, oxygen concentration in the semiconductor layer 11 gradually decreases from its surface in contact with the metal film 14a along with progress of oxidation of the metal film 14a. In addition, metal such as aluminum is diffused into the semiconductor layer 11 from the metal film 14a. The metal element functions as a dopant to reduce resistance of a region in contact with the metal film 14a in a top of the semiconductor layer 11. This results in formation of the source/drain region 11SD having a low electric resistance.

It is to be noted that the metal film 14a is preferably subjected to heat treatment through annealing at a temperature of, for example, about 300° C. Here, the metal film 14a is annealed in an oxidizing gas atmosphere containing, for example, oxygen, which suppresses an excessive reduction in oxygen concentration of the low-resistance region, so that sufficient oxygen is supplied to the semiconductor layer 11. Accordingly, a later annealing step is allowed to be omitted, leading to simplification of a process.

Alternatively, the high-resistance film 14 can be formed as follows. For example, the metal film 14a may be deposited while the substrate 10 is maintained at a relatively high temperature of about 200° C. in the step shown in FIG. 8A. As a result, resistance of the predetermined region of the semiconductor layer 11 is reduced without heat treatment as shown in FIG. 8B. In such a case, the carrier concentration in the semiconductor layer 11 is reduced to a level which may be necessary for the transistor.

The metal film 14a is preferably deposited at a thickness of, for example, 10 nm or less. This is because, if the thickness of the metal film 14a is 10 nm or less, the metal film 14a is completely oxidized (the high-resistance film 14 is formed) through the heat treatment. If the metal film 14a is not completely oxidized, such an unoxidized metal film 14a needs to be removed in an additional etching step. This is because, since the metal film 14a is also deposited on the gate electrode 13A, if the metal film is not sufficiently oxidized, a leakage current may occur. If the metal film 14a is completely oxidized and thus the high-resistance film 14 is formed, such a removal step is unnecessary, so that the manufacturing process is simplified. That is, the leakage current is prevented without the removal step using etching. It is to be noted that, in the case where the metal film 14a is deposited at the thickness of 10 nm or less, thickness of the high-resistance film 14 is about 20 nm or less after the heat treatment.

While the metal film 14a is oxidized through the above-described heat treatment, oxidization of the metal film 14a can be accelerated through a method such as oxidization in a steam atmosphere and plasma oxidization. In particular, the plasma oxidization has the following advantage. Specifically, the interlayer insulating film 15 is allowed to be successively (continuously) formed by the plasma CVD process after formation of the high-resistance film 14 through plasma oxidization of the metal film 14a. This eliminates an additional step for oxidization. The plasma oxidization is desirably performed, for example, with a plasma generated in a gas atmosphere containing oxygen, for example, a mixed gas of oxygen and dinitroxide, at a temperature of the substrate 10 of about 200° C. to 400° C. both inclusive. This is because such plasma processing provides a high-resistance film 14 having a high barrier performance against the external atmosphere as described above.

In addition, the resistance of the predetermined region of the semiconductor layer 11 can be reduced through plasma processing or diffusion of hydrogen from a silicon nitride film deposited by a plasma CVD process, in addition to a reaction of the metal film 14a and the semiconductor layer 11 as described above.

Figure 9A:
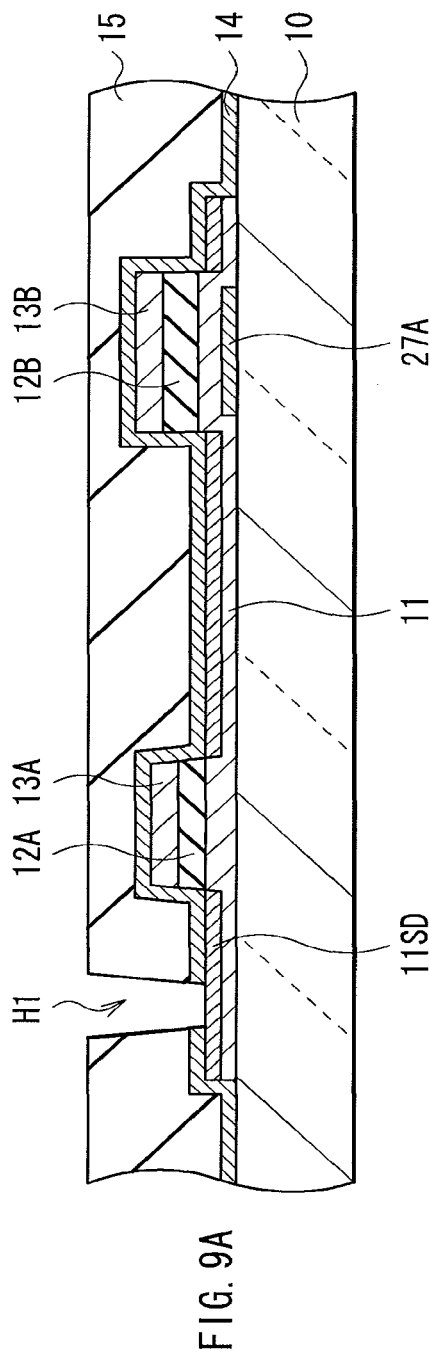
FIGS. 9A and 9B illustrate steps following the step in FIG. 8B.

Then, the interlayer insulating film 15 is formed as shown in FIG. 9A. Specifically, the interlayer insulating film 15, which includes the above-described organic film including acryl resin or inorganic film including a silicon oxide film or an aluminum oxide film, or a stacked film of the organic film and the inorganic film, is deposited in the above-described thickness over the entire surface of the high-resistance film 14. The silicon oxide film is desirably deposited by, for example, a plasma CVD process, and the aluminum oxide film is desirably deposited by a reactive sputtering process using a DC or AC power source with an aluminum target. This is because such a deposition process achieves high-speed deposition. The organic film is deposited by, for example, spin coating or slit coating.

The contact hole H1 is then formed so as to penetrate the interlayer insulating film 15 and the high-resistance film 14 by, for example, photolithography and etching in a part of the region opposed to the source/drain region 11SD of the semiconductor layer 11.

Figure 9B:
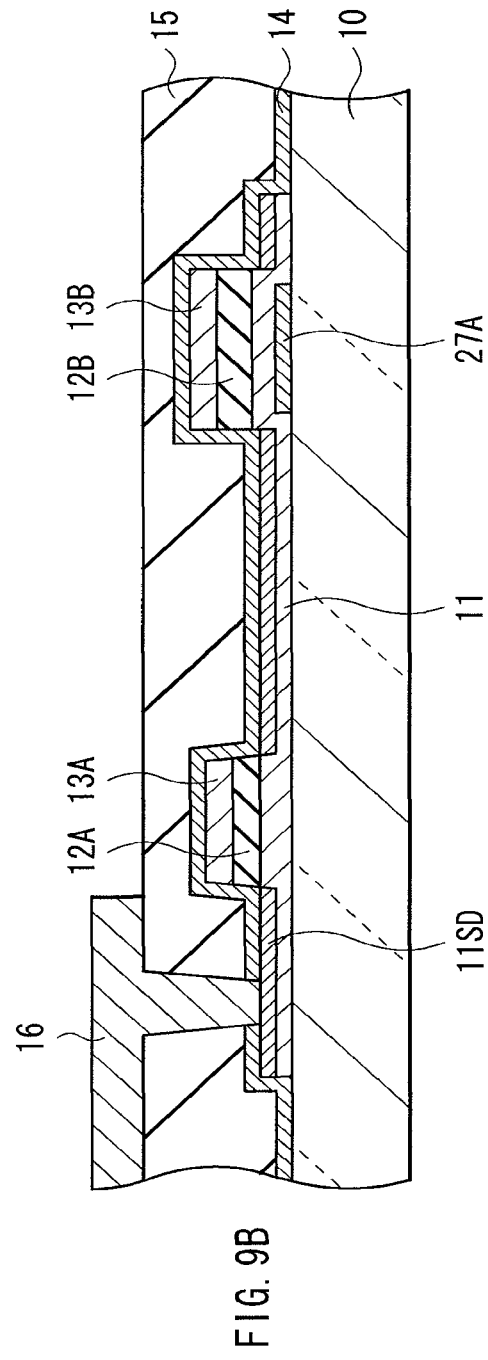

As shown in FIG. 9B, the source/drain electrode layer 16 including the above-described material and the like is then deposited by, for example, a sputtering process on the interlayer insulating film 15 so as to fill the contact hole H1. The source/drain electrode layer 16 is then patterned into a predetermined shape by photolithography and etching. Consequently, the source/drain electrode layer 16 is formed while being electrically connected to the source/drain region 11SD of the semiconductor layer 11. The transistor 10B and the holding capacitance element 10C are formed on the substrate 10 as described above.

The planarization film 17 including the above-described material is then deposited covering the interlayer insulating film 15 and the source/drain electrode layer 16 by, for example, spin coating or slit coating. The contact hole H2 is then formed in a part of the region opposed to the source/drain electrode layer 16.

The organic EL element 10A is then formed on the planarization film 17. Specifically, the first electrode 18 including the above-described material is deposited by, for example, a sputtering process on the planarization film 17 so as to fill the contact hole H2, and then the first electrode 18 is patterned by photolithography and etching. The pixel separation film 19 having the opening is then formed on the first electrode 18, and the organic layer 20 is deposited by, for example, a vacuum evaporation process. The second electrode 21 including the above-described material is then deposited by, for example, a sputtering process on the organic layer 20. The passivation layer 22 is then deposited by, for example, a CVD process on the passivation layer 22, and then the sealing substrate 23 is attached on the passivation layer 22. This is the end of the manufacturing process of the organic EL display device 1A shown in FIG. 1.

[Operation and Effects]

In the organic EL display device 1A of the first embodiment, for example, when a drive current corresponding to a video signal of each color is applied to each pixel corresponding to one of R, G, and B, electrons and holes are, respectively, injected into the organic layer 20 through the first and second electrodes 18 and 21. The electrons and the holes are recombined in the organic EL layer in the organic layer 20, leading to light emission. In this way, the organic EL display device 1A performs full-color video display of R, G, and B, for example.

In the organic EL display device 1A, electric potential corresponding to a video signal is applied to one end of the holding capacitance element 10C during the video display operation as described above, so that electric charge corresponding to the video signal is accumulated in the holding capacitance element 10C. In the embodiment, the holding capacitance element 10C has a stacked structure where the semiconductor layer 11 including the oxide semiconductor and the insulating film 12B is sandwiched between the conductive film 27A and the conductive film 13B, as described above.

Figure 10:
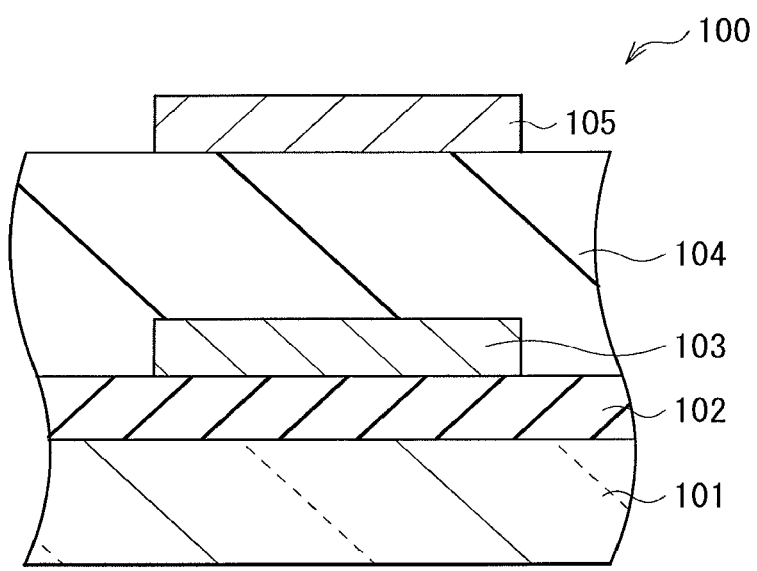
FIG. 10 is a schematic view illustrating a sectional structure of a holding capacitance element according to a comparative example 1.

FIG. 10 illustrates a stacked structure of a holding capacitance element 100 according to a comparative example (comparative example 1) of the embodiment. In the comparative example 1, for example, an insulating film 102 is formed of part of a gate insulating film of a transistor on a substrate 101, and a conductive film 103 is provided on the insulating film 102 (in the same layer as a gate electrode of the transistor). An interlayer insulating film 104 having a large thickness is provided on the conductive film 103, and a conductive film 105 is provided in the same layer as a source/drain electrode layer on the interlayer insulating film 104. In this way, the holding capacitance element 100 of the comparative example 1 has a structure where the interlayer insulating film 104 is sandwiched between the conductive films 103 and 105 that are provided in the same layers as the gate electrode and the source/drain electrode of the transistor, respectively. Capacitance is also allowed to be formed through such a stacked structure. In such a holding capacitance element 100, however, thickness of the interlayer insulating film 104 is relatively large (of a size in micrometers), and thus capacitance is small, resulting in high sensitivity to parasitic capacitance.

In the first embodiment, the holding capacitance element 10C has a stacked structure where the semiconductor layer 11 and the insulating film 12B are sandwiched between the conductive films 27A and 13B. Consequently, the total thickness of the semiconductor layer 11 and the insulating film 12B is smaller than the interlayer insulating film 15. As a result, the holding capacitance element 10C of the embodiment has a large capacitance compared with the comparative example 1.

Figure 11A:
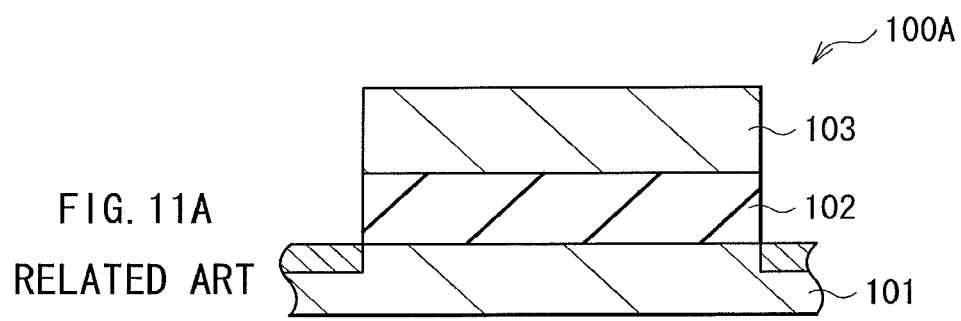
FIGS. 11A and 11B are schematic views illustrating a sectional structure and a planar structure of a holding capacitance element according to a comparative example 2.
Figure 11B:
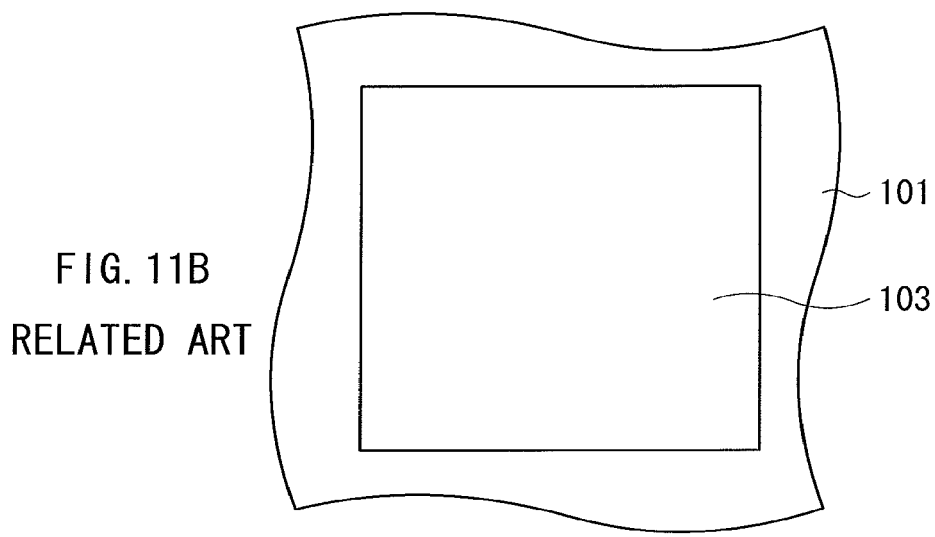

FIGS. 11A and 11B illustrate a stacked structure of a holding capacitance element 100A according to another comparative example (comparative example 2) of the first embodiment. In the holding capacitance element 100A, a conductive film 103 is provided on a semiconductor layer 101 with an insulating film 102 formed of a gate insulating film therebetween, and a certain capacitance is provided through such a stacked structure. While such a holding capacitance element 100A achieves a relatively large capacitance as in the first embodiment, the capacitance easily varies depending on voltages applied between the semiconductor layer 101 and the conductive film 103. Such variations in capacitance may lead to insufficient capacitance depending on drive conditions of a pixel circuit, leading to degradation in image quality.

In the embodiment, the holding capacitance element 10C has a structure where the conductive film 27A is disposed below the semiconductor layer 11, and the semiconductor layer 11 and the insulating film 12B are sandwiched between the conductive film 27A and the conductive film 13B formed of the gate electrode 13A. The voltage supplied to the holding capacitance element 10C is held between the conductive films 27A and 13B instead of the semiconductor layer 11, which reduces the variations in capacitance depending on applied voltages.

In the first embodiment, the holding capacitance element 10C, which is provided together with the organic EL element 10A and the transistor 10B on the substrate 10, has the stacked structure where the semiconductor layer 11 including the oxide semiconductor and the insulating film 12B (including the same material as that of the gate insulating film 12A) are sandwiched between the conductive film 27A and the conductive film 13B (including the same material as that of the gate electrode 13A), as described above. This suppresses variations in capacitance of the holding capacitance element 10C depending on applied voltages, so that a desired capacitance is maintained, leading to suppression of degradation in image quality.

In addition, this allows the active-drive display to show high-quality images, leading to a large screen, high resolution, and high frame rate. Furthermore, since the holding capacitance element 10C has a relatively large capacitance, occupancy of wirings is reduced in a pixel layout, so that a display panel having a small number of defects is manufactured at a high yield.

Second Embodiment

Figure 12:
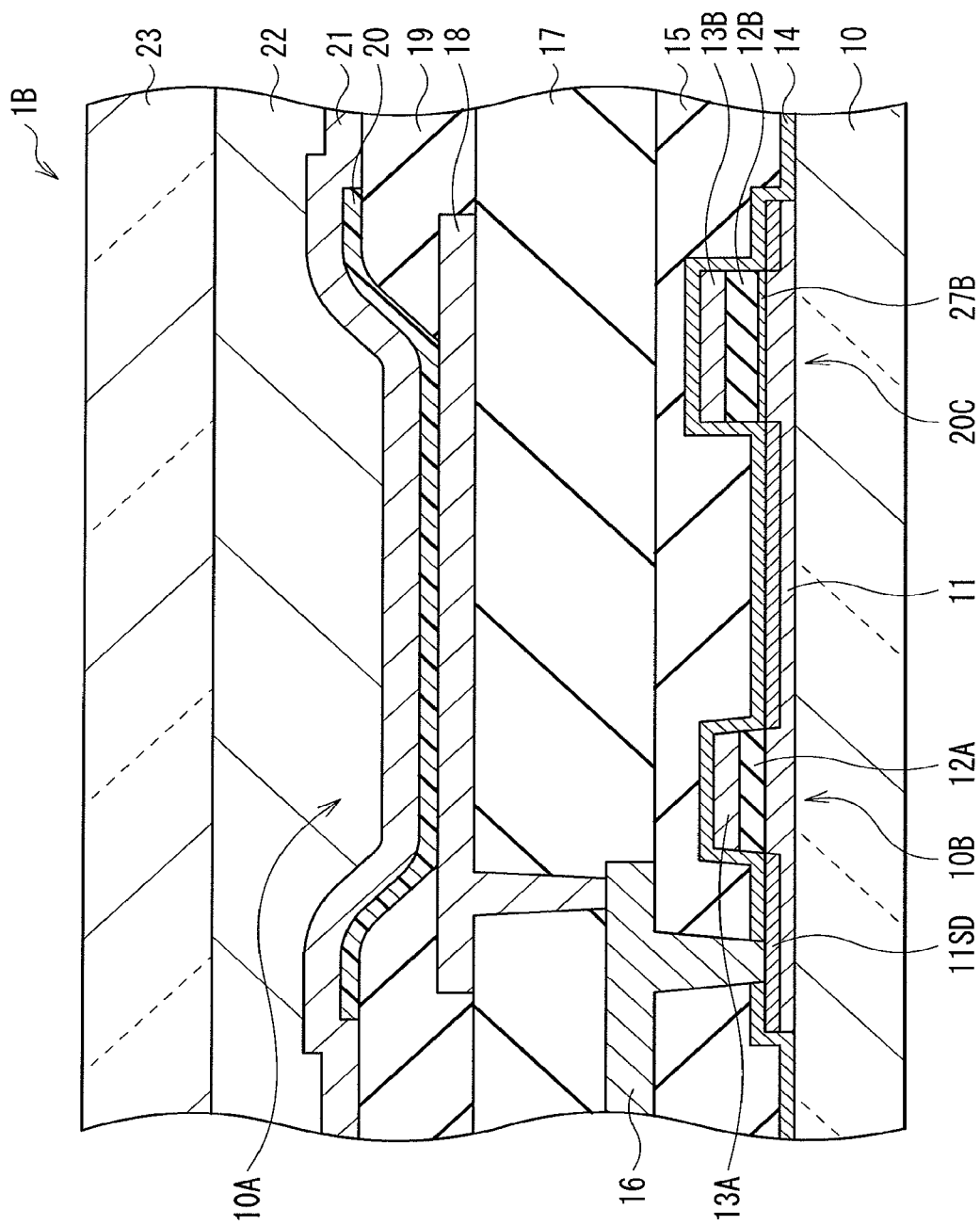
FIG. 12 illustrates a sectional structure of an organic EL display device according to a second embodiment of the disclosure.

FIG. 12 illustrates a sectional structure of a display device (organic EL display device 1B) according to a second embodiment of the disclosure. The organic EL display device 1B includes a plurality of pixels (organic EL elements 10A), which are driven by active-matrix drive, for example, and a transistor 10B and a holding capacitance element 10C for driving the pixels for display, as the organic display device 1A in the first embodiment. Each organic EL element 10A is sealed by a passivation layer 22 and a sealing substrate 23. Each transistor 10B is a top-gate thin film transistor having a semiconductor layer 11 including an oxide semiconductor. It is to be noted that a similar components to those in the first embodiment are designated by the same symbols, and description thereof is appropriately omitted.

[Configuration]

Figure 13:
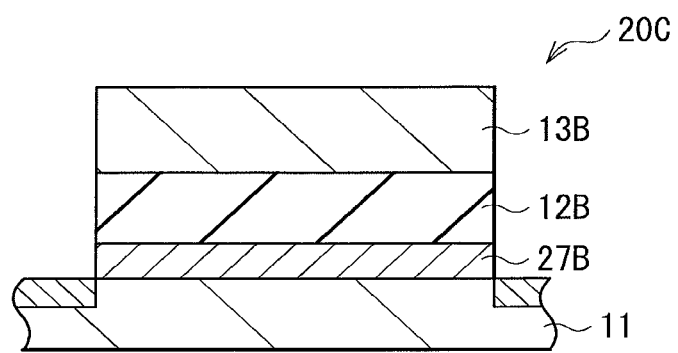
FIG. 13 illustrates a sectional structure of a holding capacitance element shown in FIG. 12 in an enlarged manner.

The holding capacitance element 20C holds electric charge corresponding to a video signal in the pixel circuit 50a described above as in the first embodiment. FIG. 13 illustrates an enlarged sectional structure of the holding capacitance element 20C. While the holding capacitance element 20C is formed of part of a stacked structure of the transistor 10B, it has a different stacked structure from the holding capacitance element 10C of the first embodiment. In detail, in the holding capacitance element 20C, the semiconductor layer 11, a conductive film 27B, an insulating film 12B, and a conductive film 13B are stacked in order of closeness to a substrate 10. That is, the conductive film 27B is provided on or above the semiconductor layer 11 (in a region closer to the insulating film 12B). Specifically, in the holding capacitance element 20C, the conductive film 27B, the insulating film 12B, and the conductive film 13B are provided in this order on a selective region in the semiconductor layer 11, and a certain capacitance is provided due to the stacked structure where the insulating film 12B is sandwiched between the conductive films 27B and 13B.

It is to be noted that the conductive film 27B of the holding capacitance element 20C corresponds to a specific example of "first conductive film" of the second display device of the disclosure, and the conductive film 13B corresponds to a specific example of "second conductive film" thereof.

In such a configuration, the insulating film 12B is also formed of, for example, the same material as that of the gate insulating film 12A of the transistor 10B, and formed in the same step as that thereof. Similarly, the conductive film 13B is formed of, for example, the same material as that of the gate electrode 13A, and formed in the same step as that thereof.

The conductive film 27B includes, for example, a single-layer film including one of titanium, aluminum, and molybdenum, or a stacked film including two or more of them, and has a thickness of, for example, about 50 nm. In the embodiment, the conductive film 27B is formed after formation of the semiconductor layer 11.

The above-described organic EL display device 1B is manufactured, for example, as follows. The transistor 10B and the holding capacitance element 20C are first formed on the substrate 10. Specifically, the semiconductor layer 11 is first deposited by, for example, a sputtering process on the substrate 10, as shown in FIG. 14A, and then patterned into a predetermined shape by photolithography or any other process. The conductive film 27B including the above-described material and the like is then deposited by, for example, a sputtering process on the entire surface of the substrate 10.

The conductive film 27B is then patterned by photolithography and etching to be provided on a selective region in the semiconductor layer 11, as shown in FIG. 14B. During the etching, the conductive film 27B needs to be selectively removed without etching the semiconductor layer 11. For example, in the case where the conductive film 27B is wet-etched with a liquid of phosphoric/acetic/nitric acid, crystalline indium-gallium oxide (IGO) or indium-zinc oxide (IZO), or amorphous indium-tin-zinc oxide (ITZO) is desirably used for the semiconductor layer 11. In the case where indium-tin-zinc oxide (ITZO) is used for the semiconductor layer 11, a high etching selectively of the conductive film 27B to the semiconductor layer 11 is achieved through a dry etching process of the conductive film 27B. Materials of the conductive film 27B, which are etched with the phosphoric/acetic/nitric acid, include titanium, molybdenum, and aluminum, for example.

Figure 15A:
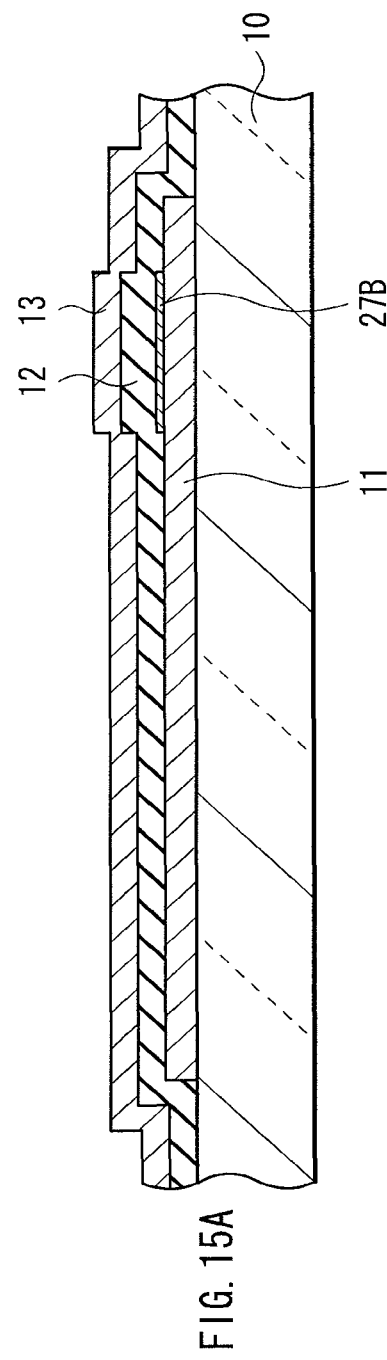
FIGS. 15A and 15B illustrate steps following a step in FIG. 14B.

The insulating film 12 (the gate insulating film 12A and the insulating film 12B) including, for example, a silicon oxide film or an aluminum oxide film is deposited over the entire surface of the substrate 10 by a similar process to that in the first embodiment, as shown in FIG. 15A. The conductive film 13 (the gate electrode 13A and the conductive film 13B) is then deposited over the entire surface of the insulating film 12 by a similar process to that in the first embodiment.

Figure 15B:
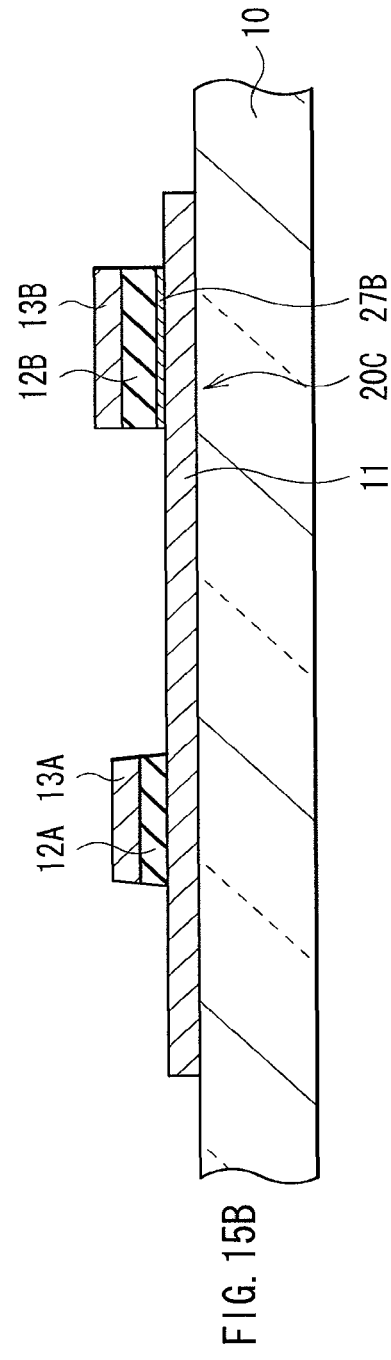

The conductive film 13 is then patterned by a similar process to that in the first embodiment (the gate electrode 13A and the conductive film 13B are formed), and then the insulating film 12 is etched, as shown in FIG. 15B. Here, in the case where the semiconductor layer 11 is formed of a crystalline material such as ZnO, IZO, and IGO, an etchant such as hydrofluoric acid is used so as to facilitate the etching process as in the first embodiment. Consequently, the gate insulating film 12A is patterned in substantially the same shape as the gate electrode 13A, and the insulating film 12B and the conductive film 13B are formed on the conductive film 27B. In this way, the holding capacitance element 20C including the stacked structure of the conductive film 27B, the insulating film 12B, and the conductive film 13B is formed on the selective region in the semiconductor layer 11.

The holding capacitance element 20C is formed in the above way, and then a metal film 14a (not shown) is deposited over the entire surface of the substrate 10 as in the first embodiment. A high-resistance film 14 is then formed through, for example, heat treatment, and a source/drain region 11SD is formed in a predetermined region on a top side of the semiconductor layer 11. An interlayer insulating film 15 and a source/drain electrode layer 16 are then formed as in the first embodiment, so that the transistor 10B is formed. A planarization film 17, the organic EL element 10A, and the passivation layer 22 are formed on the substrate 10, on which the transistor 10B and the holding capacitance element 20C are formed in the above way, and then the sealing substrate 23 is attached on the passivation layer 22, as in the first embodiment. This is the end of the manufacturing process of the organic EL display device 1B shown in FIG. 12.

[Operation and Effects]

In the organic EL display device 1B of the second embodiment, when a drive current corresponding to a video signal of each color is applied to each pixel through a first electrode 18 and a second electrode 21, an organic layer 20 emits light, as in the organic EL display device 1A of the first embodiment. This results in full-color video display of R, G, and B, for example. During this, electric potential corresponding to a video signal is applied to one end of the holding capacitance element 20C, so that electric charge is accumulated in the holding capacitance element 20C. Here, the holding capacitance element 20C has a stacked structure where the insulating film 12B having a relatively small thickness is sandwiched between the conductive film 27B and the conductive film 13B, leading to a relatively large capacitance. As a result, influence of the parasitic capacitance is reduced. In addition, the holding capacitance element 20C has a structure where the insulating film 12B formed of the gate insulating film 12A is sandwiched between the conductive film 27B and the conductive film 13B formed of the gate electrode 13A. The voltage supplied to the holding capacitance element 20C is held between the conductive films 27A and 13B instead of in the semiconductor layer 11, which reduces the variations in capacitance depending on applied voltages.

In the second embodiment, the holding capacitance element 20C, which is provided together with the organic EL element 10A and the transistor 10B on the substrate 10, has the stacked structure where the insulating film 12B (including the same material as that of the gate insulating film 12A) is sandwiched between the conductive film 27B and the conductive film 13B (including the same material as that of the gate electrode 13A), as described above. This suppresses the variations in capacitance of the holding capacitance element 20C depending on applied voltages, so that a desired capacitance is maintained, as in the first embodiment. Consequently, effects equivalent to that in the first embodiment are achieved.

In addition, the holding capacitance element 20C of the second embodiment has the conductive film 27B on or above the semiconductor layer 11, and thus has the stacked structure, where only the insulating film 12B is sandwiched between the conductive films 27B and 13B, different from that of the holding capacitance element 10C of the first embodiment. As a result, the holding capacitance element 20C has a larger capacitance than the holding capacitance element 10C of the first embodiment, so that the influence of the parasitic capacitance is more effectively reduced.

[Modification]

Figure 16:
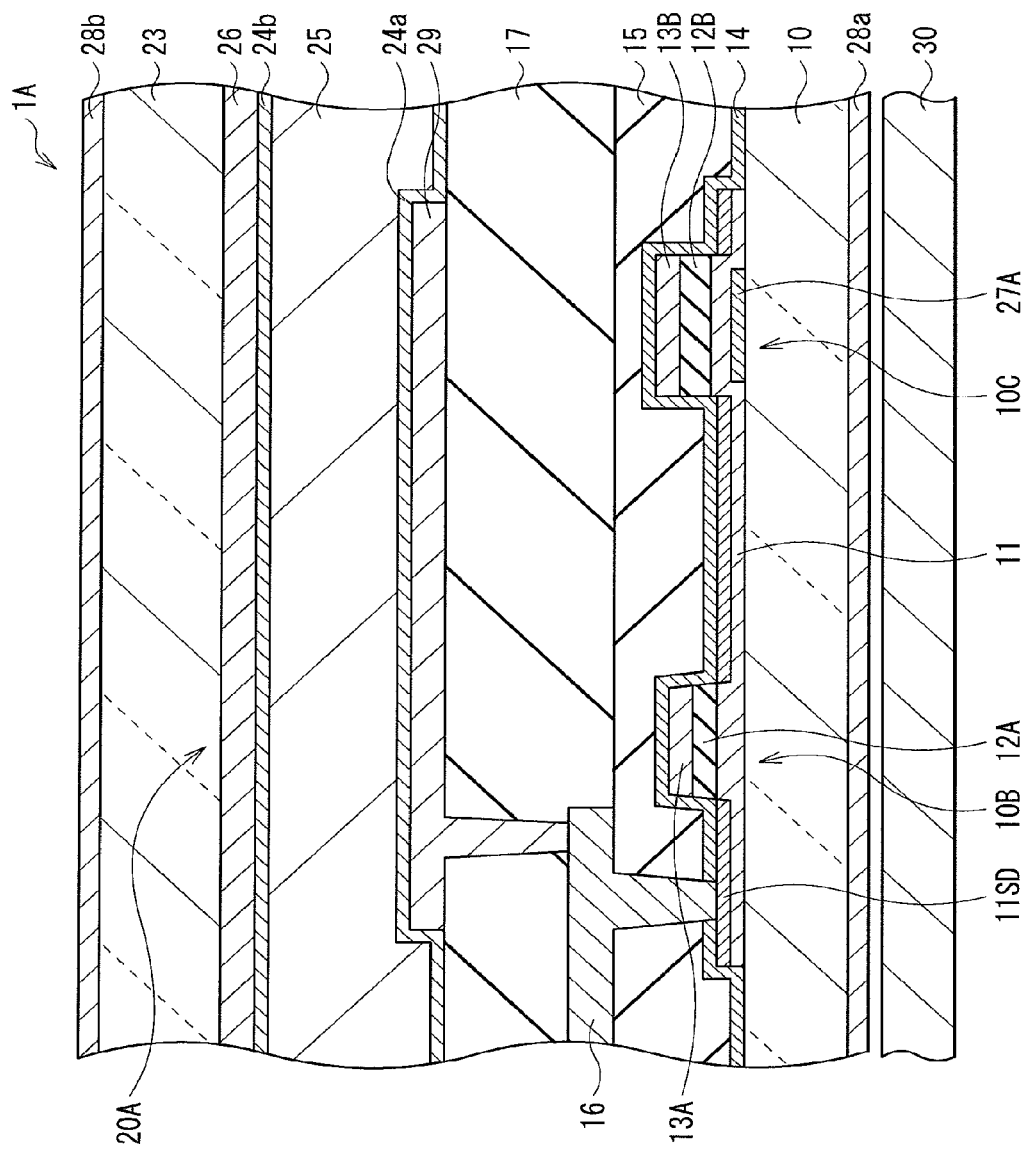
FIG. 16 illustrates a sectional structure of a liquid crystal display device according to a modification.

A display device (liquid crystal display device 2) according to a modification of the disclosure is now described. FIG. 16 illustrates a sectional structure of the liquid crystal display device 2. The liquid crystal display device 2 includes a display element, a transistor 10B, and a holding capacitance element 10C on a substrate 10, as in the organic EL display device 1A of the first embodiment, though the display element is a liquid crystal display element 20A instead of the organic EL element. Specifically, in the liquid crystal display device 2, the transistor 10B and the holding capacitance element 10C are provided on the substrate 10, and the liquid crystal display element 20A is provided on or above them. A backlight 30 is provided below the substrate 10. Polarizing plates 28a and 28b are attached to the substrate 10 on its backlight 30 side and onto a sealing substrate 23, respectively. It is to be noted that similar components to those in the embodiments are designated by the same symbols, and description thereof is appropriately omitted. In addition, while the modification is exemplified with the holding capacitance element 10C described in the first embodiment, it may be exemplified with the holding capacitance element 20C described in the second embodiment.

In the liquid crystal display element 20A, for example, a liquid crystal layer 25 is enclosed between a pixel electrode 29 and a counter electrode 26, and alignment films 24a and 24b are provided on respective surfaces facing the liquid crystal layer 25 of the pixel electrode 29 and of the counter electrode 26. The pixel electrode 29 is provided for each pixel, and electrically connected to a source/drain electrode layer 16 of the transistor 10B, for example. The counter electrode 26 is provided in common to a plurality of pixels, and maintained at a common electric potential, for example. The liquid crystal layer 25 includes a liquid crystal that is driven in a vertical alignment (VA) mode, a twisted nematic (TN) mode, or an in-plane switching (IPS) mode, for example.

The backlight 30 is a light source that emits light to the liquid crystal layer 25, and includes, for example, a plurality of light emitting diodes (LEDs) or cold cathode fluorescent lamps (CCFLs). The backlight 30 is controlled to be on or off by an undepicted backlight drive section.

The polarizing plates 28a and 28b (a polarizer and an analyzer) are disposed in a crossed-Nicol manner, for example, so that light illuminated from the backlight 30 is blocked (OFF) during no voltage application, and transmitted (ON) during voltage application.

In such a liquid crystal display device 2, the holding capacitance element 10C has a stacked structure where the semiconductor layer 11 and the insulating film 12B are sandwiched between the conductive films 27A and 13B as in the organic EL display device 1A of the first embodiment. Consequently, the holding capacitance element 10C of the modification also has a relatively large capacitance, and reduces voltage dependence of the capacitance. Specifically, the display device of the disclosure is applied not only to the above-described organic EL display device 1A but also to the liquid crystal display device 2.

Application Examples

Hereinafter, application examples of the above-described display devices (the organic EL display devices 1A and 1B, and the liquid crystal display device 2) to electronic units are described. The electronic units include, for example, a television apparatus, a digital camera, a notebook personal computer, a mobile terminal device such as a mobile phone, and a video camcorder. In other words, the above-described display devices are applicable to electronic units in various fields for displaying externally-received or internally-generated video signals as still or video images.

[Module]

Figure 17:
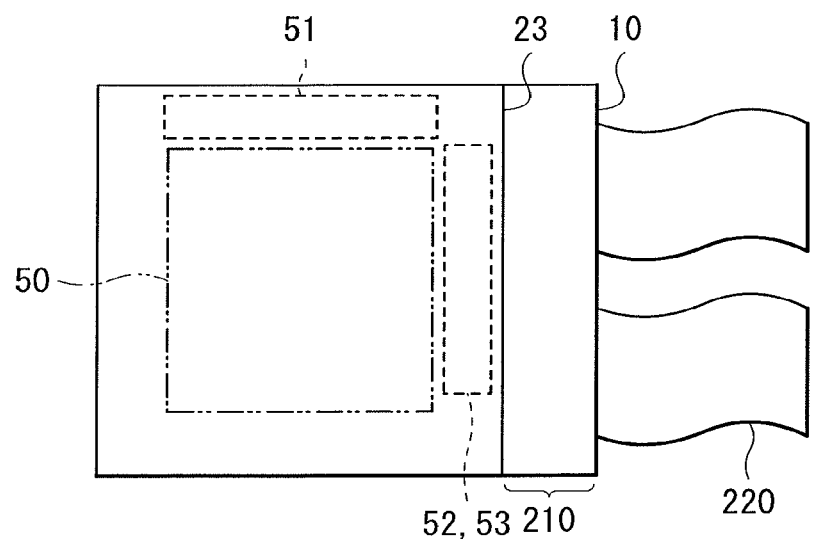
FIG. 17 is a plan view illustrating a schematic configuration of a module with a display device.

Each of the display devices is built in various electronic units such as application examples 1 to 5 described below, for example, as a module shown in FIG. 17. In the module, for example, one side of the substrate 10 has a region 210 exposed from the sealing substrate 23, and an external connection terminal (not shown) is provided on the exposed region 210 by extending wirings for the horizontal scanner 51, the write scanner 52, and the power supply scanner 53. The external connection terminal may be attached with a flexible printed circuit (FPC) 220 for input/output of signals.

Application Example 1

Figure 18:
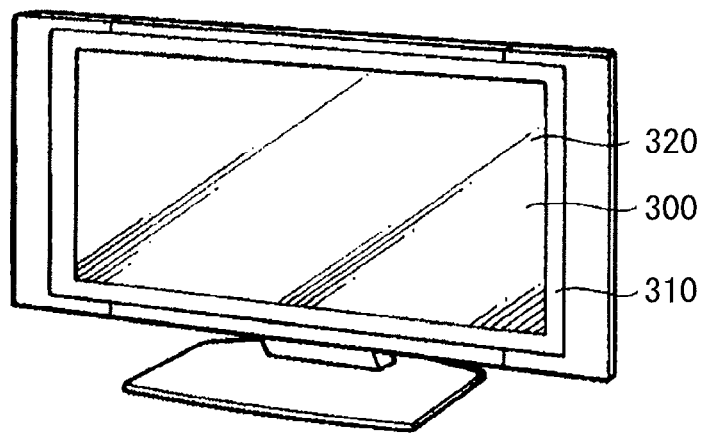
FIG. 18 is a perspective view illustrating appearance of an application example 1.

FIG. 18 illustrates appearance of a television apparatus. The television apparatus has, for example, an image display screen section 300 including a front panel 310 and filter glass 320, and the image display screen section 300 corresponds to the display device.

Application Example 2

Figure 19A:
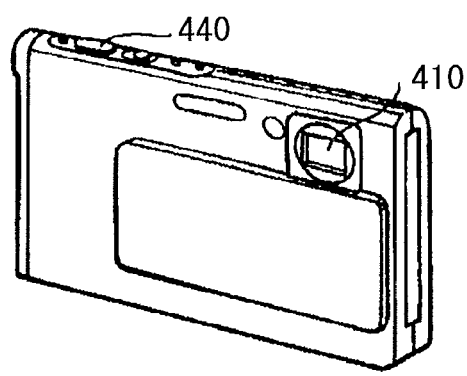
FIG. 19A is a perspective view illustrating appearance of an application example 2 as viewed from its front side.
Figure 19B:
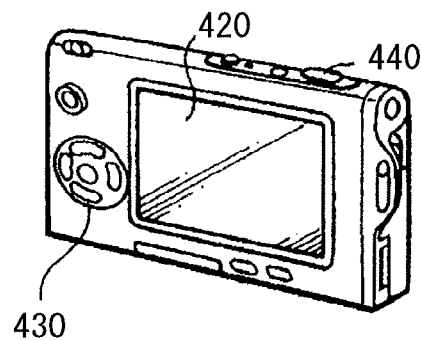
FIG. 19B is a perspective view illustrating appearance thereof as viewed from its back side.

FIGS. 19A and 19B illustrate appearance of a digital camera. The digital camera has, for example, a light emitting section 410 for flash, a display section 420, a menu switch 430, and a shutter button 440, and the display section 420 corresponds to the display device.

Application Example 3

Figure 20:
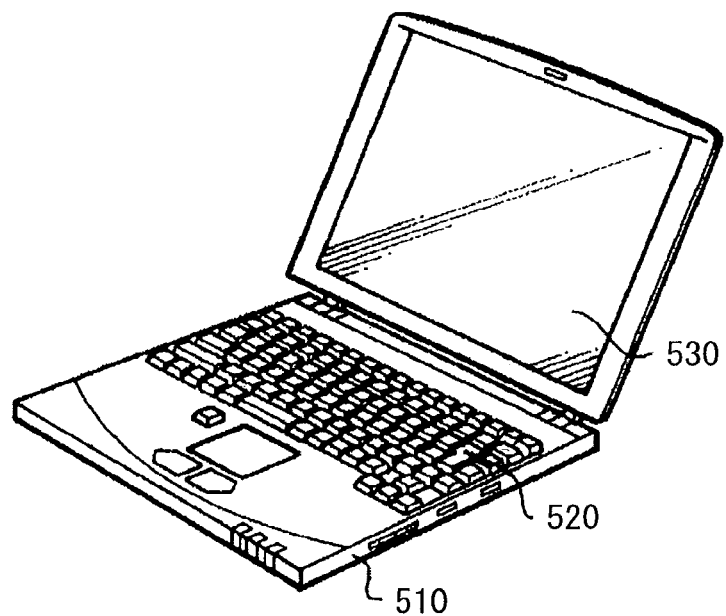
FIG. 20 is a perspective view illustrating appearance of an application example 3.

FIG. 20 illustrates appearance of a notebook personal computer. The notebook personal computer has, for example, a main body 510, a keyboard 520 for input of letters and the like, and a display section 530 for displaying images, and the display section 530 corresponds to the display device.

Application Example 4

Figure 21:
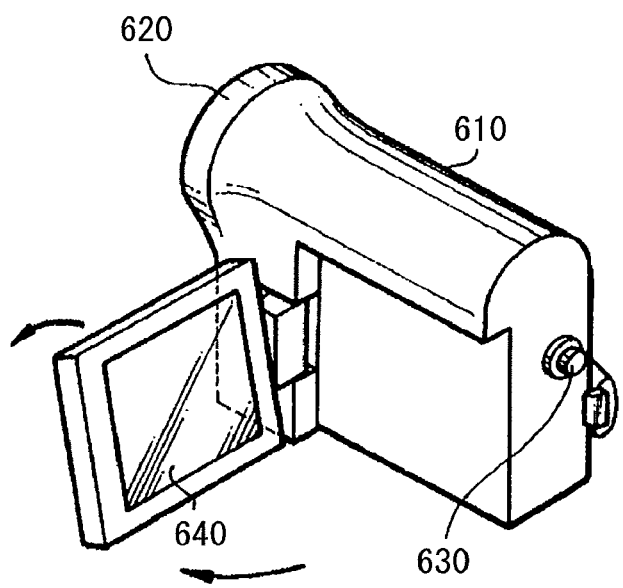
FIG. 21 is a perspective view illustrating appearance of an application example 4.

FIG. 21 illustrates appearance of a video camcorder. The video camcorder has, for example, a main body section 610, an object-shooting lens 620 provided on a front side of the main body section 610, a start/stop switch 630 for shooting, and a display section 640. The display section 640 corresponds to the display device.

Application Example 5

FIGS. 22A to 22G illustrate appearance of a mobile phone. For example, the mobile phone is configured of an upper housing 710 and a lower housing 720 connected to each other by a hinge section 730, and has a display 740, a sub-display 750, a picture light 760, and a camera 770. The display 740 or the sub display 750 corresponds to the display device.

While the disclosure has been described with the embodiments and the modification hereinbefore, the disclosure is not limited to the embodiments and the modification, and various other modifications or alterations are made. For example, while the embodiments and the modification have been exemplified with a configuration where the insulating film 12B of the holding capacitance element 10C or 20C is separately patterned from the gate insulating film 12A of the transistor 10B, the gate insulating film 12A and the insulating film 12B are not necessarily separated, and may be continuously provided from the transistor 10B to the holding capacitance element 10C or 20C. In addition, while the semiconductor layer 11 has been exemplified to be integrally (continuously) provided from the transistor 10B to the holding capacitance element 10C or 20C, the semiconductor layer 11 may be separately provided in each of the transistor 10B and the holding capacitance element 10C or 20C.

Furthermore, while the embodiments and the modification have been described with the exemplary structure having the high-resistance film 14, the high-resistance film 14 may be omitted. However, the structure desirably has the high-resistance film 14 to stably maintain the electric characteristics of the transistor 10B and of the holding capacitance element 10C or 20C as described above.

In addition, while the resistance of the predetermined region of the semiconductor layer 11 is reduced through the reaction of the metal film 14a and the semiconductor layer 11 in the embodiments and the modification, the resistance can be reduced through plasma processing, or diffusion of hydrogen from a silicon nitride film deposited by a plasma CVD process.

It is possible to achieve at least the following configurations from the above-described exemplary embodiments and the modifications of the disclosure.

(1) A display device comprising:
a substrate;
a display element;
a transistor as a drive element of the display element; and
a holding capacitance element holding electric charge corresponding to a video signal, and including a first conductive film, a first semiconductor layer including an oxide semiconductor, an insulating film, and a second conductive film in order of closeness to the substrate, wherein
the display element, the transistor, and the holding capacitance element are provided on the substrate.

(2) The display device according to (1), wherein the transistor includes
a second semiconductor layer including an oxide semiconductor,
a gate insulating film provided on a selective region in the second semiconductor layer,
a gate electrode provided on the gate insulating film, and
a source/drain electrode layer being electrically connected to the second semiconductor layer in order of closeness to the substrate.

(3) The display device according to (2), wherein the first conductive film is provided on a selective region in the substrate,
the first and second semiconductor layers are integrally formed of a same material on the substrate,
the insulating film is formed of a same material as a material of the gate insulating film, and
the second conductive film is formed of a same material as a material of the gate electrode.

(4) The display device according to (2) or (3), wherein the first and second semiconductor layers have a low-resistance region having a lower electric resistance than other regions in a region unopposed to both the holding capacitance element and the gate electrode, and
the source/drain electrode layer is electrically connected to the low-resistance region.

(5) The display device according to any one of (2) to (4), wherein a high-resistance film is provided covering the holding capacitance element, the gate electrode, and the low-resistance region of the first and second semiconductor layers.

(6) The display device according to any one of (1) to (5), wherein the display element is an organic electroluminescence element.

(7) The display device according to any one of (1) to (5), wherein the display element is a liquid crystal display element.

(8) A display device comprising:
a substrate;
a display element;
a transistor as a drive element of the display element; and
a holding capacitance element holding electric charge corresponding to a video signal, and including a first semiconductor layer including an oxide semiconductor, a first conductive film, an insulating film, and a second conductive film in order of closeness to the substrate, wherein
the display element, the transistor, and the holding capacitance element are provided on the substrate.

(9) The display device according to (8), wherein the transistor includes
a second semiconductor layer including an oxide semiconductor,
a gate insulating film provided on a selective region in the second semiconductor layer,
a gate electrode provided on the gate insulating film, and
a source/drain electrode layer being electrically connected to the second semiconductor layer in order of closeness to the substrate.

(10) The display device according to (9), wherein the first and second semiconductor layers are integrally formed of a same material on the substrate,
the insulating film is formed of a same material as a material of the gate insulating film, and
the second conductive film is formed of a same material as a material of the gate electrode.

(11) The display device according to (9) or (10), wherein the first conductive film is provided on the selective region in the second semiconductor layer, and configured of a single-layer film including one of aluminum (Al), molybdenum (Mo), and titanium (Ti) or a stacked film including two or more of aluminum (Al), molybdenum (Mo), and titanium (Ti), and
the first and second semiconductor layers each include one of indium-tin-zinc oxide (ITZO), indium-zinc oxide (IZO), indium-gallium oxide (IGO), and indium-gallium-zinc oxide (IGZO).

(12) The display device according to any one of (9) to (11), wherein the first and second semiconductor layers have a low-resistance region having a lower electric resistance than other regions in a region unopposed to both the holding capacitance element and the gate electrode, and
the source/drain electrode layer is electrically connected to the low-resistance region.

(13) The display device according to any one of (9) to (12), wherein a high-resistance film is provided covering the holding capacitance element, the gate electrode, and the low-resistance region of the first and second semiconductor layers.

(14) The display device according to any one of (8) to (13), wherein the display element is an organic electroluminescence element.

(15) The display device according to any one of (8) to (13), wherein the display element is a liquid crystal display element.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
   a substrate;
   a display element;
   a transistor as a drive element of the display element, and including a second semiconductor layer including an oxide semiconductor, a gate insulating film provided on a selected region in the second semiconductor layer, and a gate electrode provided on the gate insulating film in order of closeness to the substrate; and
   a holding capacitance element holding electric charge corresponding to a video signal, and including a first conductive film, a first semiconductor layer including an oxide semiconductor, an insulating film, and a second conductive film in order of closeness to the substrate, wherein
   the display element, the transistor, and the holding capacitance element are provided on the substrate, wherein the first and second semiconductor layers are formed of a same material on the substrate, and wherein the gate insulating film of the transistor and the insulating film of the holding capacitance element are separated from one another by a gap.

2. The display device according to claim 1, wherein the transistor further includes
   a source drain electrode layer being electrically connected to the second semiconductor layer in order of closeness to the substrate.

3. The display device according to claim 2, wherein the first conductive film is provided on a selected region in the substrate, and the insulating film is formed of a same material as a material of the gate insulating film.

4. The display device according to claim 2, wherein the first and second semiconductor layers have a low-resistance region having a lower electric resistance than other regions in a region unopposed to both the holding capacitance element and the gate electrode, and
   the source/drain electrode layer is electrically connected to the low-resistance region.

5. The display device according to claim 2, wherein a high-resistance film is provided covering the holding capacitance element, the gate electrode, and the low resistance region of the first and second semiconductor layers.

6. The display device according to claim 1, wherein the display element is an organic electroluminescence element.

7. The display device according to claim 1, wherein the display element is a liquid crystal display element.

8. An electronic unit with a display device, the display device comprising:
   a substrate;
   a display element;
   a transistor as a drive element of the display element, and including a second semiconductor layer including an oxide semiconductor, a gate insulating film provided on a selected region in the second semiconductor layer, and a gate electrode provided on the gate insulating film in order of closeness to the substrate; and
   a holding capacitance element holding electric charge corresponding to a video signal, and including a first conductive film, a first semiconductor layer including an oxide semiconductor, an insulating film, and a second conductive film in order of closeness to the substrate, wherein
   the display element, the transistor, and the holding capacitance element are provided on the substrate, wherein the first and second semiconductor layers are formed of a same material on the substrate, and wherein the gate insulating film of the transistor and the insulating film of the holding capacitance element are separated from one another by a gap.

* * * * *